US011411094B2

(12) United States Patent
Cheng et al.

(10) Patent No.: US 11,411,094 B2
(45) Date of Patent: Aug. 9, 2022

(54) CONTACT WITH A SILICIDE REGION

(71) Applicant: Taiwan Semiconductor Manufacturing Co., Ltd., Hsinchu (TW)

(72) Inventors: Yu-Wen Cheng, Tainan (TW); Cheng-Tung Lin, Jhudong Township (TW); Chih-Wei Chang, Hsinchu (TW); Hong-Mao Lee, Hsinchu (TW); Ming-Hsing Tsai, Chu-Pei (TW); Sheng-Hsuan Lin, Zhubei (TW); Wei-Jung Lin, Hsinchu (TW); Yan-Ming Tsai, Toufen Township (TW); Yu-Shiuan Wang, Taipei (TW); Hung-Hsu Chen, Tainan (TW); Wei-Yip Loh, Hsinchu (TW); Ya-Yi Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 90 days.

(21) Appl. No.: 16/740,881

(22) Filed: Jan. 13, 2020

(65) Prior Publication Data

US 2020/0152763 A1   May 14, 2020

Related U.S. Application Data

(62) Division of application No. 15/909,838, filed on Mar. 1, 2018, now Pat. No. 10,535,748.

(51) Int. Cl.
*H01L 29/66*     (2006.01)
*H01L 29/45*     (2006.01)
(Continued)

(52) U.S. Cl.
CPC ...... *H01L 29/665* (2013.01); *H01L 21/02063* (2013.01); *H01L 21/02068* (2013.01);
(Continued)

(58) Field of Classification Search
CPC . H01L 21/823418–823425; H01L 21/823814; H01L 29/66636–66643;
(Continued)

(56) References Cited

U.S. PATENT DOCUMENTS 9,105,490 B2   8/2015   Wang et al.
9,236,267 B2   1/2016   De et al.
(Continued)

OTHER PUBLICATIONS

Piallat et al., "Investigation of TiN Thin Film Oxidation Depending on the Substrate Temperature at Vacuum Break" Journal of Vacuum Science & Technology, A 34, 051508, 2016.

*Primary Examiner* — Nelson Garces
(74) *Attorney, Agent, or Firm* — Slater Matsil, LLP

(57) ABSTRACT

Embodiments disclosed herein relate generally to forming an effective metal diffusion barrier in sidewalls of epitaxy source/drain regions. In an embodiment, a structure includes an active area having a source/drain region on a substrate, a dielectric layer over the active area and having a sidewall aligned with the sidewall of the source/drain region, and a conductive feature along the sidewall of the dielectric layer to the source/drain region. The source/drain region has a sidewall and a lateral surface extending laterally from the sidewall of the source/drain region, and the source/drain region further includes a nitrided region extending laterally from the sidewall of the source/drain region into the source/drain region. The conductive feature includes a silicide region along the lateral surface of the source/drain region and along at least a portion of the sidewall of the source/drain region.

20 Claims, 15 Drawing Sheets

(51) Int. Cl.
| | |
|---|---|
| H01L 21/768 | (2006.01) |
| H01L 21/02 | (2006.01) |
| H01L 21/326 | (2006.01) |
| H01L 29/78 | (2006.01) |
| H01L 29/08 | (2006.01) |
| H01L 21/311 | (2006.01) |
| H01L 21/306 | (2006.01) |
| H01L 21/266 | (2006.01) |
| H01L 21/265 | (2006.01) |
| H01L 21/3105 | (2006.01) |
| H01L 21/321 | (2006.01) |

(52) U.S. Cl.
CPC ...... *H01L 21/02247* (2013.01); *H01L 21/326* (2013.01); *H01L 21/7685* (2013.01); *H01L 21/76802* (2013.01); *H01L 21/76843* (2013.01); *H01L 21/76877* (2013.01); *H01L 29/0847* (2013.01); *H01L 29/45* (2013.01); *H01L 29/6656* (2013.01); *H01L 29/66795* (2013.01); *H01L 29/7851* (2013.01); *H01L 21/02252* (2013.01); *H01L 21/266* (2013.01); *H01L 21/26513* (2013.01); *H01L 21/30604* (2013.01); *H01L 21/31053* (2013.01); *H01L 21/31116* (2013.01); *H01L 21/3212* (2013.01); *H01L 29/66545* (2013.01); *H01L 29/66636* (2013.01)

(58) Field of Classification Search
CPC . H01L 29/66696; H01L 29/0843–0891; H01L 29/665; H01L 21/02247; H01L 21/02249; H01L 21/02329–02332; H01L 21/02614; H01L 21/3211; H01L 21/76855
See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2016/0336412 | A1* | 11/2016 | Hung ................ H01L 29/66636 |
| 2017/0103948 | A1 | 4/2017 | Lee et al. |

* cited by examiner

CONTACT WITH A SILICIDE REGION

PRIORITY CLAIM AND CROSS-REFERENCE

This application is a divisional of U.S. application Ser. No. 15/909,838, filed on Mar. 1, 2018, which application is hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices.

FinFET devices typically include semiconductor regions used to form source regions and drain regions. Metal silicides are then formed on the surfaces of the semiconductor regions in order to reduce the contact resistance between metal contact plugs (for contacting the silicide regions) and the semiconductor regions. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
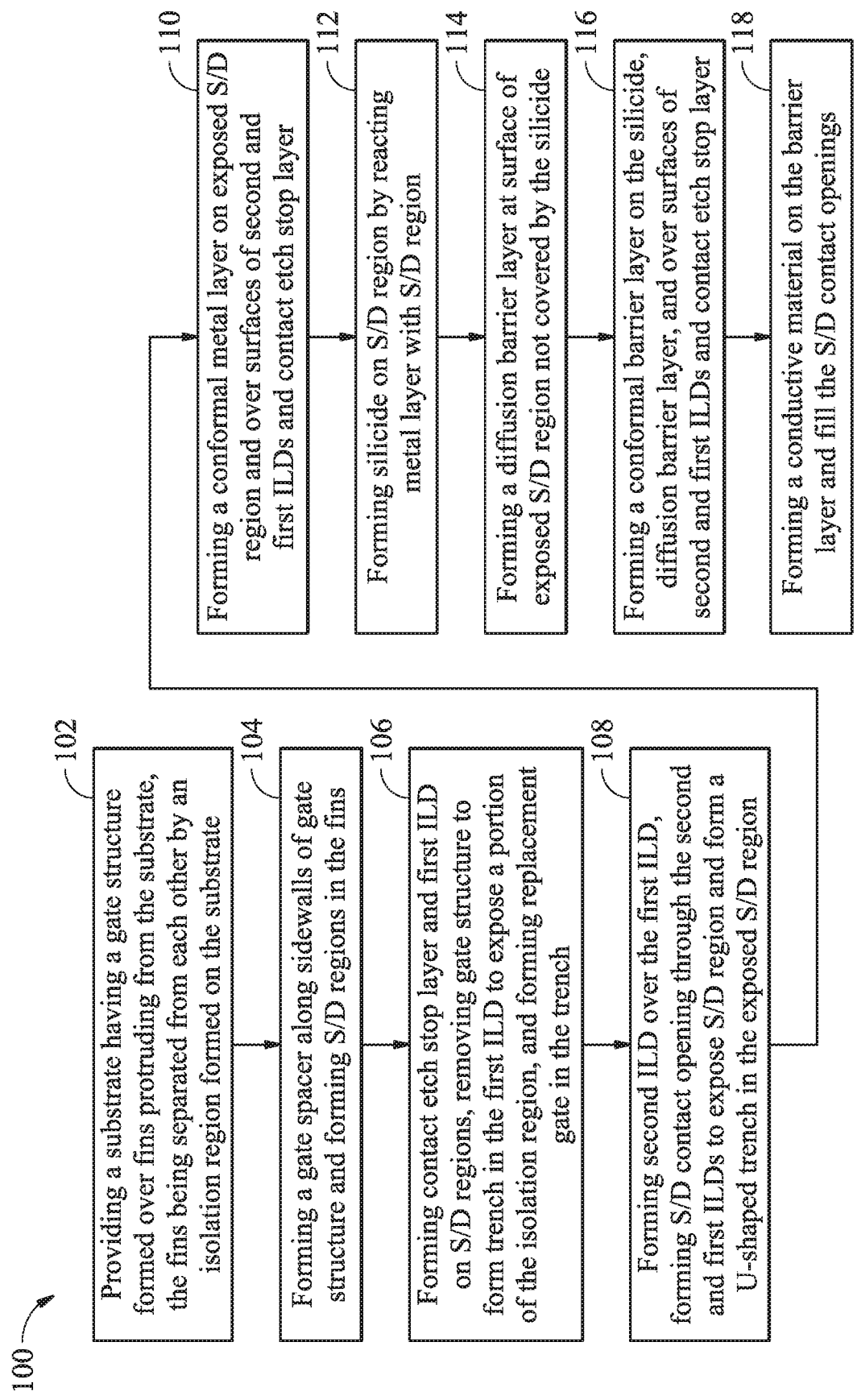
FIG. 1 is a flow chart illustrating an exemplary method for fabricating a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments to be described below provide a structure and methods to prevent sidewalls of epitaxy source/drain regions exposed through a contact opening from reacting with a contact metal and forming unwanted metal silicide by forming an effective metal diffusion barrier in the sidewalls without growing additional film in the contact opening. In addition or in other examples, a damage-free cleaning method is also provided for removal of oxides from a metal barrier that is formed on a silicide. The metal barrier can be restored to its original conditions and then treated to allow the metal barrier to be re-used.

The foregoing broadly outlines some aspects of embodiments described in this disclosure. It is contemplated that the concepts of the present disclosure may be implemented for a planar transistor device or for a three-dimensional transistor device, such as the semiconductor device 201 described in this disclosure. Some example devices for which aspects described herein may be implemented include fin field effect transistors (FinFETs), Horizontal Gate All Around (HGAA) FETs, Vertical Gate All Around (VGAA) FETs, nanowire channel FETs, strained-semiconductor devices, silicon-on-insulator (SOI) devices, or other devices that can be beneficial from the pre-treatment process to mitigate the issues associated with loading effect and/or substrate-dependent growth.

Figure 2:
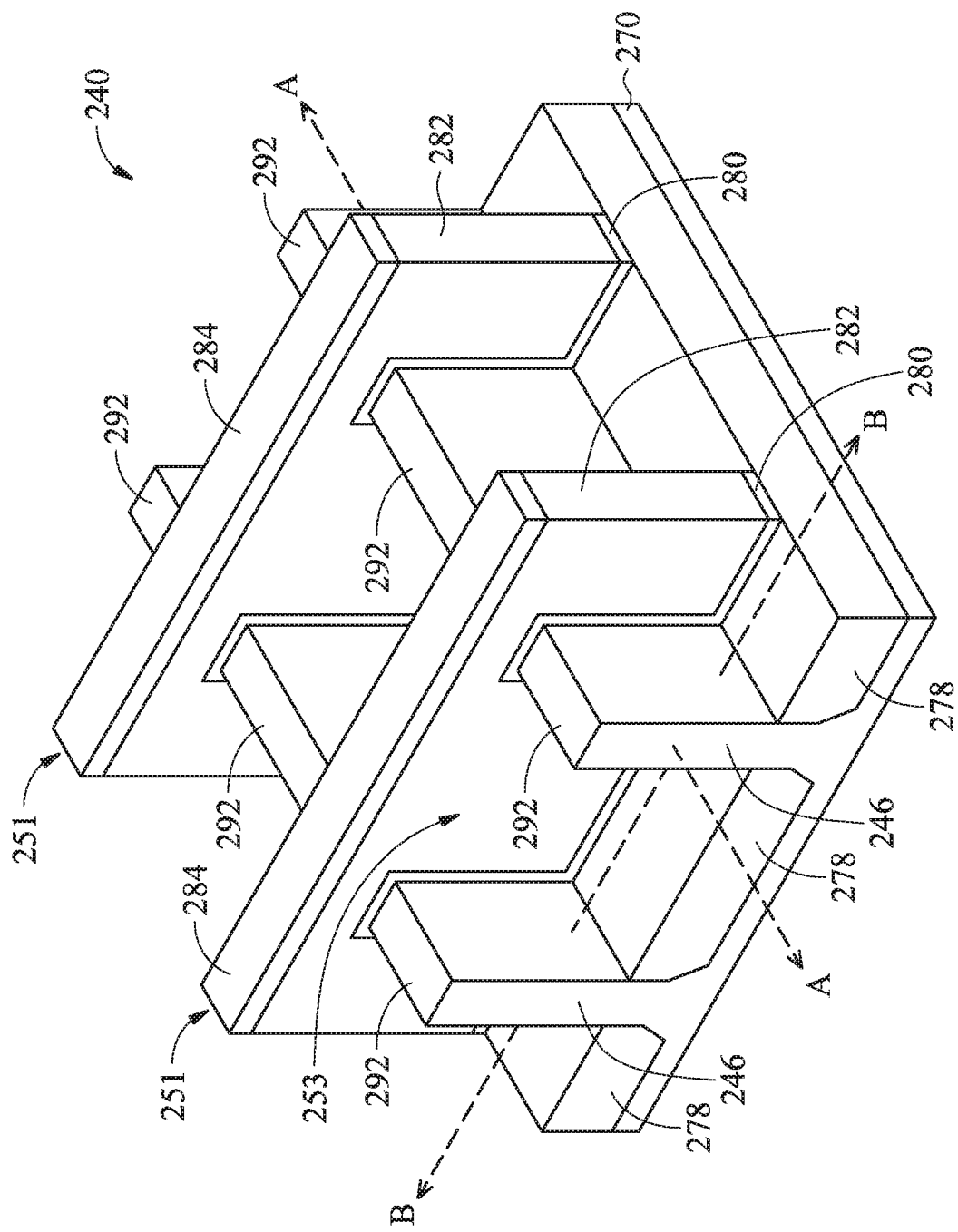
FIG. 2 illustrates a perspective view of an example of the semiconductor device in a three-dimensional view corresponding to a stage of fabrication according to some embodiments.

FIG. 1 is a flow chart 100 illustrating an exemplary method for fabricating a semiconductor device 240 according to various embodiments. FIG. 2 illustrates an example of the semiconductor device 240 in a three-dimensional view. FIGS. 3A-3B through 8A-8B and 11A-11B through 12A-12B are schematic cross-sectional views of a portion of the semiconductor device 240 corresponding to various stages of fabrication according to the flow chart of FIG. 1. It is noted that the flow chart 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

The flow chart 100 begins at operation 102 by providing a semiconductor device 240. The semiconductor device 240 has fins 274 formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof. Each fin 274 provides an active area where one or more devices are formed. The fins 274 are fabricated using suitable processes performed on the semiconductor substrate 270, including masking, photolithography, and/or etch processes, to form trenches 253 into the substrate 270, leaving the fins extended upwardly from the substrate 270. The trenches 253 may then be filled with an insulating material such as an oxide (e.g., silicon oxide), a nitride, the like, or a combination thereof. The insulating material may be recessed, such as by using an acceptable etch process, to form the isolation regions 278. The insulating material is recessed such that the fins 274 protrude above and from between neighboring isolation regions 278.

The semiconductor device 240 has gate structures 251 formed over top surfaces of the fins 274. Each gate structure 251 includes gate dielectrics 280, gate layers 282 over the gate dielectrics 280, and masks 284 over the gate layers 282, as shown in FIG. 2. The semiconductor device 240 also includes source/drain regions 292 disposed in opposing regions of the fins 274 with respect to the gate structures 251. FIG. 2 further illustrates reference cross-sections that are used in later figures. Cross-section A-A is in a plane along, e.g., channels in the fins 274 between opposing source/drain regions 292. Cross-section B-B is in a plane perpendicular to cross-section A-A and is across source/drain regions 292 in fins 274. Subsequent figures refer to these reference cross-sections for clarity. The following figures ending with an "A" designation illustrate cross-sectional views at various instances of processing corresponding to cross-section A-A, and the following figures ending with a "B" designation illustrate cross-section views at various instances of processing corresponding to cross-section B-B.

Figure 3B:
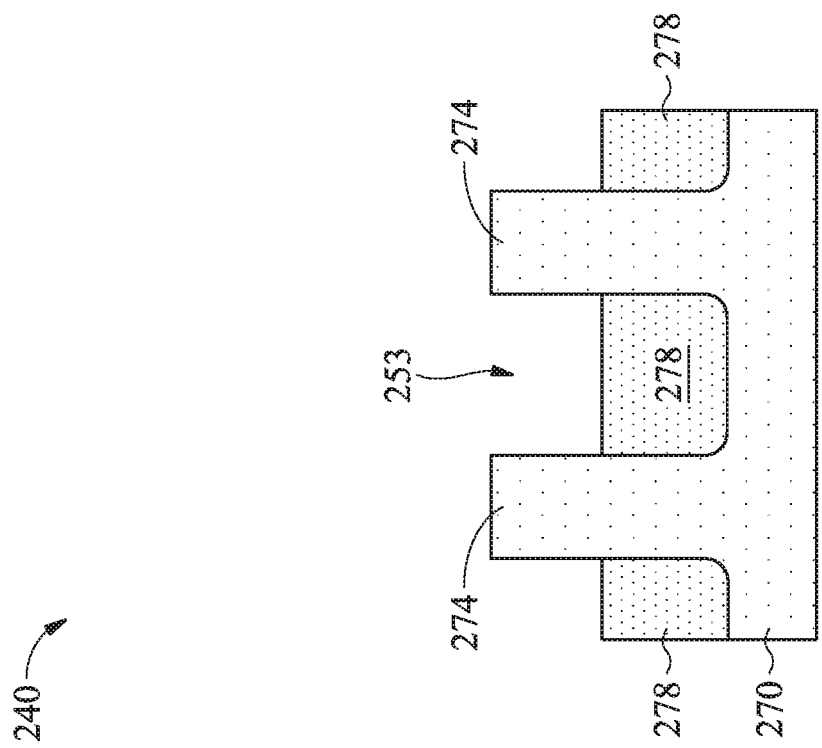
FIGS. 3A-3B through 8A-8B and 11A-11B through 12A-12B are schematic cross-sectional views of a portion of the semiconductor device corresponding to various stages of fabrication according to the flow chart of FIG. 1 according to some embodiments.
Figure 3A:
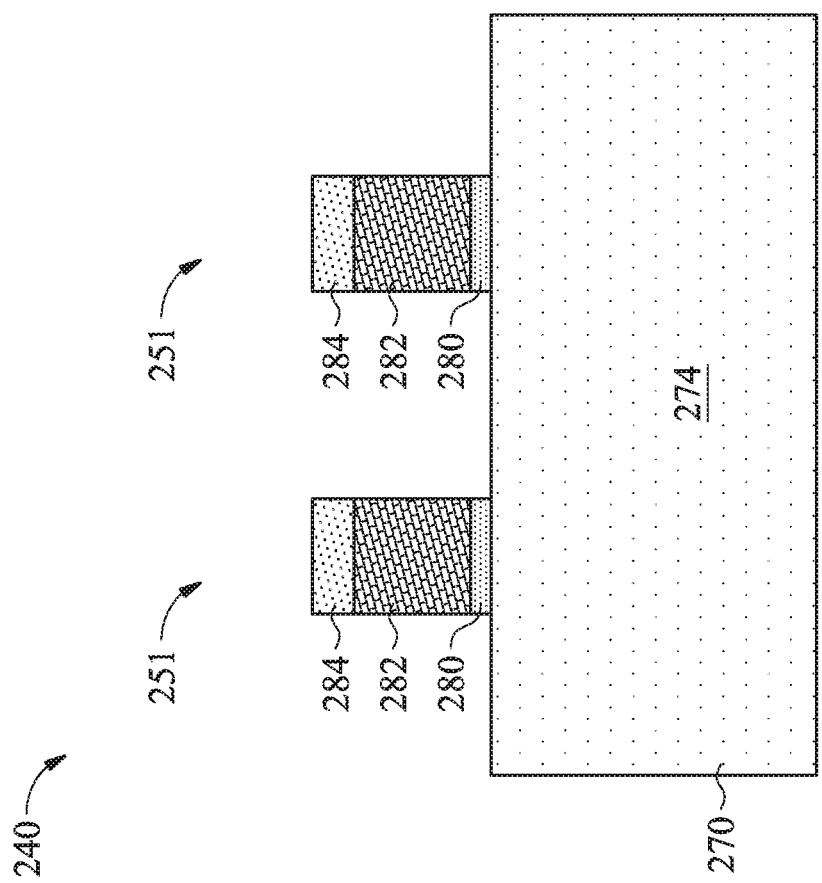

FIGS. 3A and 3B illustrate the gate structures 251 formed on the fins 274. The gate structures 251 are over and extend perpendicularly to the fins 274. The gate structures 251 can be operational gate stacks in a gate-first process or can be dummy gate stacks in a replacement gate process. For simplicity, the flow chart 100 will be described based on a replacement gate process. In a replacement gate process, the gate dielectrics 280 may be an interfacial dielectric, and the gate layers 282 may be a dummy gate. The gate dielectrics 280, the gate layers 282, and the mask 284 for the gate structures 251 may be formed by sequentially forming respective layers, and then patterning those layers into the gate structures 251. For example, a layer for the interfacial dielectrics may include or be silicon oxide, silicon nitride, the like, or multilayers thereof. A layer for the dummy gates may include or be silicon (e.g., polysilicon) or another material. A layer for the masks may include or be silicon nitride, silicon oxynitride, silicon carbon nitride, the like, or a combination thereof. The layers can be formed or deposited by any suitable deposition technique. The layers for the gate dielectrics 280, the gate layers 282, and the mask 284 may then be patterned, for example, using photolithography and one or more etch processes, to form the gate dielectrics 280, the gate layers 282, and the mask 284 for each gate structure 251.

At operation 104, gate spacers 286 are formed along sidewalls of the gate structures 251 (e.g., sidewalls of the gate dielectrics 280, gate layers 282, and masks 284) and over the fins 274. The gate spacers 286 may be formed by conformally depositing one or more layers for the gate spacers 286 and anisotropically etching the one or more layers, for example. The one or more layers for the gate spacers 286 may include a material different from the material(s) for the gate structure 251. In some embodiments, the gate spacer 286 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the spacer layers to form the gate spacers 286, as depicted in FIGS. 4A and 4B.

Figure 4B:
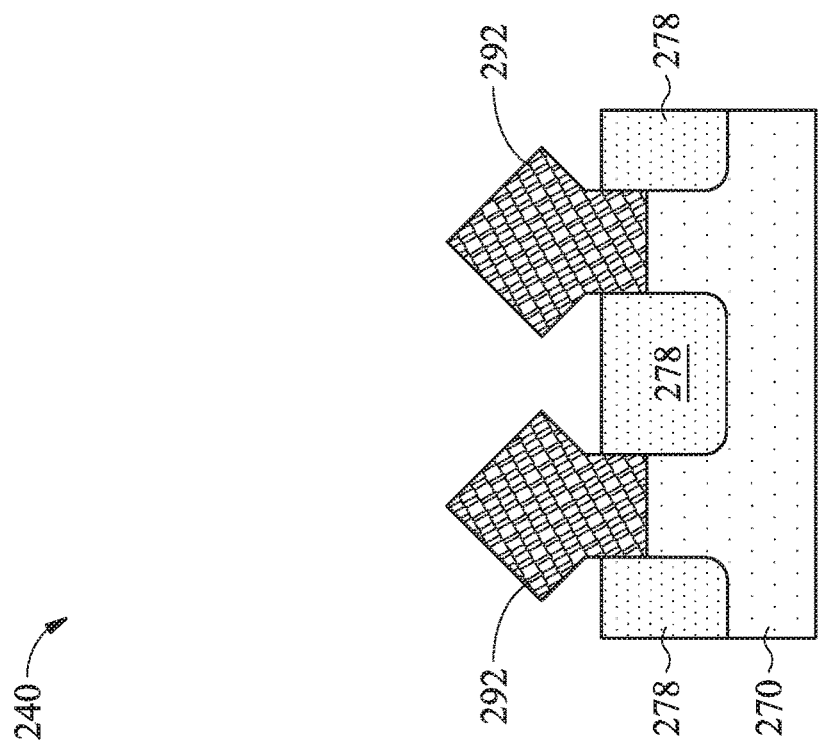
Figure 4A:
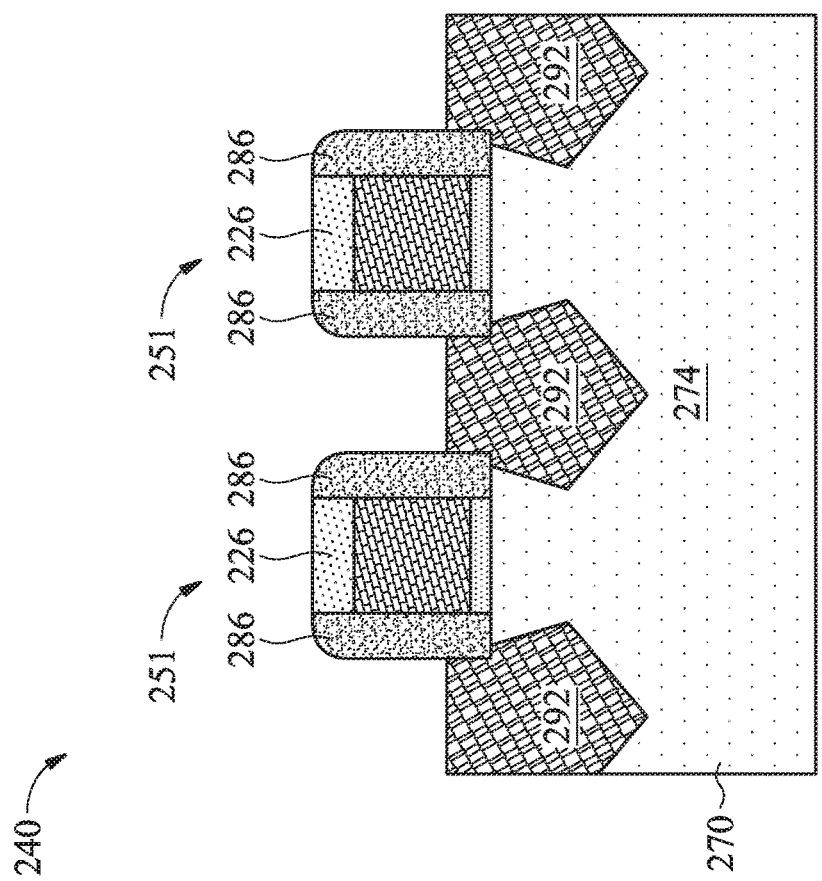

After the gate spacers 286 are formed, source/drain regions 292 may be formed in the fins 274, as depicted in FIGS. 4A and 4B. In some examples, recesses can be etched in the fins 274 using the gate structures 251 and gate spacers 286 as masks (such that recesses are formed on opposing sides of the gate structures 251), and a material may be epitaxially grown in the recesses to form the source/drain regions 292. Additionally or alternatively, the source/drain regions 292 may be formed by implanting dopants into the fins 274 and/or the epitaxial source/drain regions 292 using the gate structures 251 as masks (such that the source/drain regions are formed on opposing sides of the gate structures 251).

Depending on the conductivity type of the transistor, the material for the source/drain regions 292 may be chosen to include or be silicon germanium ($Si_xGe_{1-x}$, where x can be between approximately 0 and 100), silicon carbide, silicon phosphorus, silicon carbon phosphorus, pure or substantially pure germanium, a III-V compound semiconductor, a II-VI compound semiconductor, or the like. For example, materials for forming a III-V compound semiconductor may include InAs, AlAs, GaAs, InP, GaN, InGaAs, InAlAs, GaSb, AlSb, AlP, GaP, and the like. In some examples, SiGe may be included in the source/drain regions 292 for p-type devices while SiCP or SiP may be included in the source/drain regions 292 for n-type devices. As illustrated in FIGS. 4A and 4B, due to blocking by the isolation regions 278, the material in the source/drain regions 292 is first grown vertically in recesses, during which time the source/drain regions 292 do not grow horizontally. After the recesses are fully filled, the material for the source/drain regions 292 may grow both vertically and horizontally to form facets, which may correspond to crystalline planes of the semiconductor substrate 270. In some examples, different materials are used for epitaxy source/drain regions for p-type devices and n-type devices. Appropriate masking during the recessing or epitaxial growth may permit different materials to be used in different devices.

At operation 106, an optional contact etch stop layer (CESL) 296 and a first interlayer dielectric (ILD) 297 are sequentially formed on surfaces of the source/drain regions 292, sidewalls and top surfaces of the gate spacers 286, top surfaces of the masks 284, and top surfaces of the isolation regions 278 using any suitable deposition technique. The CESL 296 is deposited conformally and may include or be silicon nitride, silicon carbon nitride, silicon carbon oxide, carbon nitride, the like, or a combination thereof. The first ILD 297 may include or be tetraethylorthosilicate (TEOS) oxide, silicon dioxide, a low-k dielectric material (e.g., a material having a dielectric constant lower than silicon dioxide). A chemical mechanical planarization (CMP) process may then be performed to planarize the first ILD 297 and the CESL 296 and to remove the masks 284 of the gate structures 251, thereby leveling the top surface of the first ILD 297 and CESL 296 with the top surfaces of the gate layers 282.

Figure 5B:
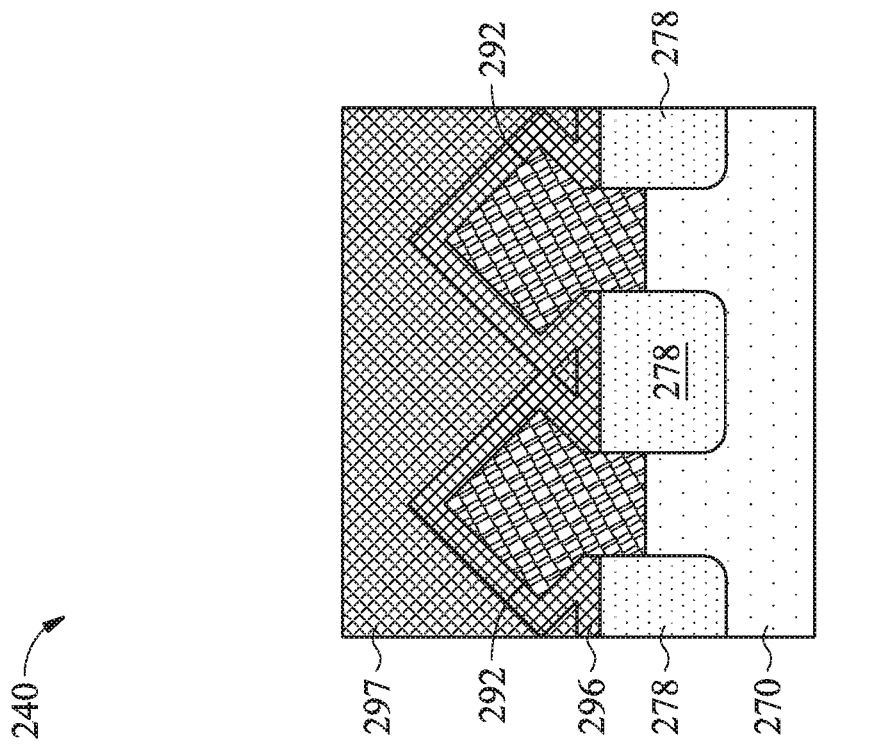
Figure 5A:
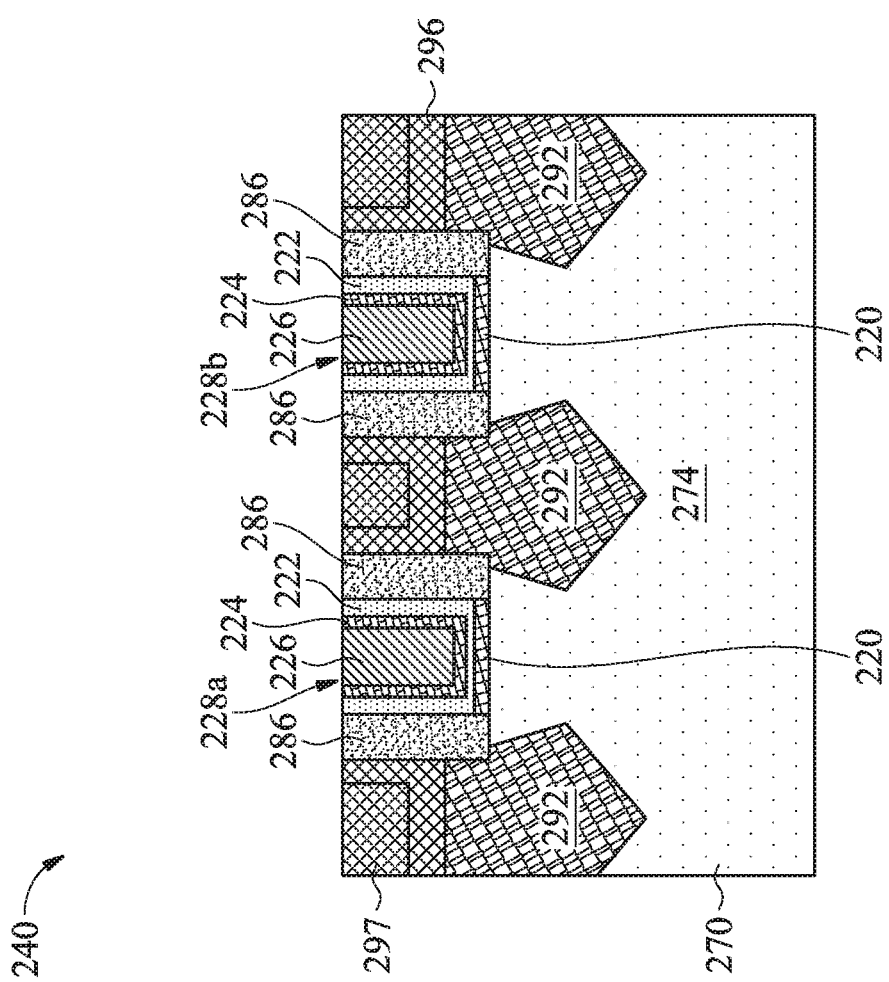

The gate structures 251 are removed using one or more etch processes. Upon removal of the gate structures 251, recesses are formed between the gate spacers 286 where the gate stacks are removed, and channel regions of the fins 274 are exposed through the recesses. The replacement gate structures 228a, 228b are then formed in the recesses where the gate structures 251 were removed. The replacement gate structures 228a, 228b each may include, as illustrated in FIG. 5A, an interfacial dielectric 220, a gate dielectric layer 222, one or more optional conformal layers 224, and a gate electrode 226. The interfacial dielectric 220 is formed on top surfaces of the fins 274 along the channel regions. The interfacial dielectric 220 can be an oxide (e.g., silicon oxide) formed by thermal or chemical oxidation of the fin 274, and/or an oxide (e.g., silicon oxide), nitride (e.g., silicon nitride), and/or another dielectric layer using any suitable deposition technique.

The gate dielectric layer 222 can be conformally deposited in the recesses where gate stacks were removed (e.g., on the interfacial dielectric 220, and sidewalls of the gate spacers 286) and on the top surfaces of the first ILD 297, the CESL 296, and gate spacers 286. The gate dielectric layer 222 can be or include silicon oxide, silicon nitride, a high-k dielectric material, multilayers thereof, or other dielectric material. A high-k dielectric material may have a k value greater than about 4.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate electrodes 226 is formed over the one or more conformal layers 224, if implemented, and/or the gate dielectric layer 222. The layer for the gate electrodes 226 can fill remaining recesses where the gate stacks were removed. The layer for the gate electrodes 226 may be or include a metal-containing material such as tungsten, cobalt, aluminum, ruthenium, copper, multi-layers thereof, a combination thereof, or the like.

A planarization process, like a CMP, may remove portions of the layer for the gate electrodes 226, one or more conformal layers 224, and gate dielectric layer 222 above the top surfaces of the first ILD 297, the CESL 296, and gate spacers 286. The replacement gate structures 228 including the gate electrodes 226, one or more conformal layers 224, gate dielectric layer 222, and interfacial dielectric 220 may therefore be formed as illustrated in FIG. 5A.

Figures 6A, 6B:
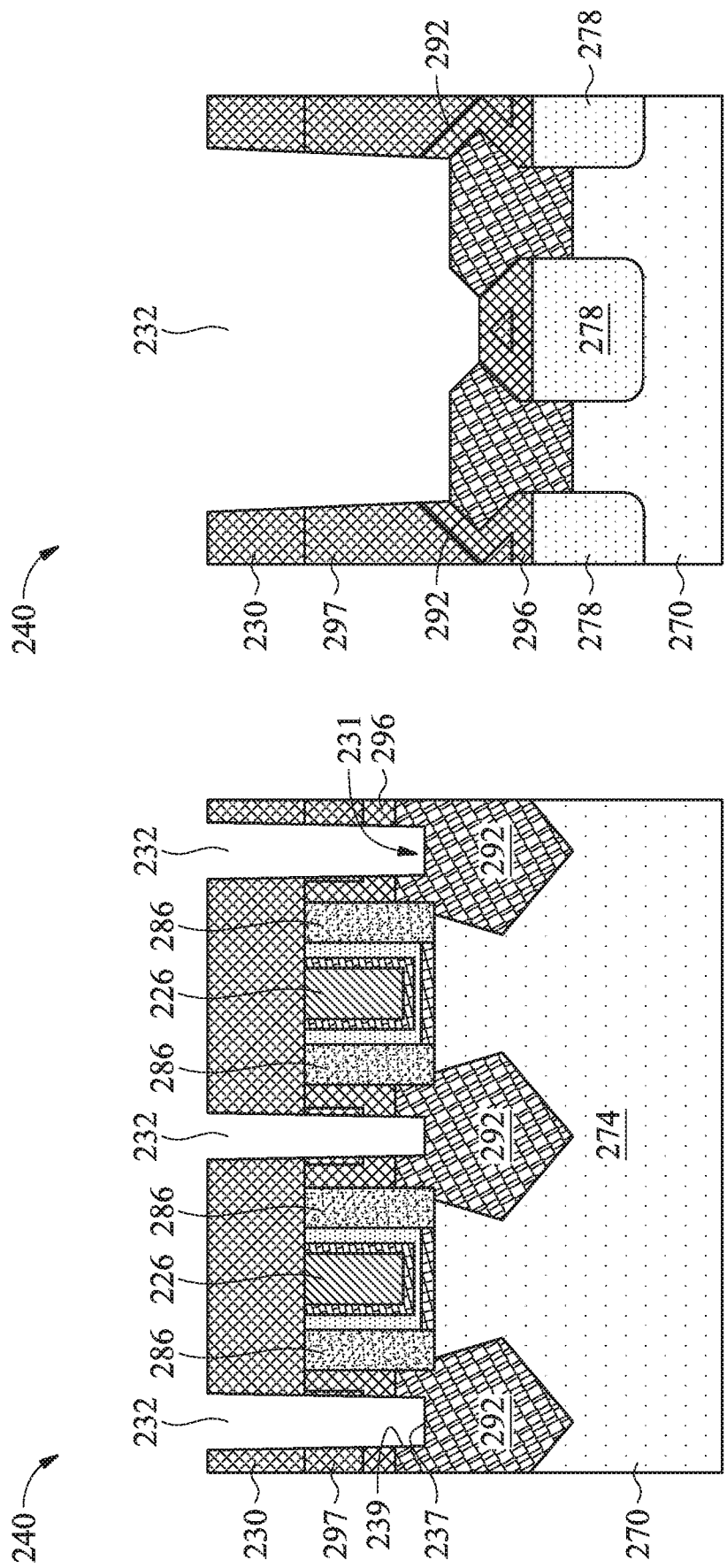

At operation 108, a second ILD 230 is formed over the gate electrodes 226, one or more conformal layers 224, and gate dielectric layer 222, first ILD 297, gate spacers 286, and CESL 296, as shown in FIG. 6A. The second ILD 230 may include or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 230 is formed, source/drain contact openings 232 are formed through the second ILD 230, the first ILD 297, and the CESL 296 to the source/drain regions 292 to expose at least portions of the source/drain regions 292, as an example shown in FIG. 6A. The second ILD 230, the first ILD 297, and the CESL 296 may be patterned with the openings 232, for example, using photolithography and one or more etch processes. The one or more etch processes may be a dry etching process, a Deep Reactive-Ion Etching (DRIE) process, or any suitable anisotropic etch process. In one example, a dry etching process using an inductively coupled plasma (ICP) or capacitively coupled plasma (CCP) containing oxygen, argon, and one or more fluorocarbon-based chemistry, such as hexafluorobutadiene ($C_4F_6$), octafluorocyclobutane ($C_4F_8$), or carbon tetrafluoride ($CF_4$), is performed to form the source/drain contact openings 232. As a result, the sidewalls of the source/drain contact openings 232 are vertical, although there may be a small tilt angle. The source/drain contact openings 232 allow making electrical contact to the source/drain regions 292 for the transistors.

After the formation of the source/drain contact openings 232, a pre-silicide clean process is performed to remove native oxide (e.g., $SiO_2$) from the surfaces of the exposed source/drain regions 292 that may be formed due to exposure to various etchants during formation of the source/drain contact openings 232. Example pre-silicide clean process may include a wet cleaning using a dilute HF aqueous solution or a dry cleaning using a plasma (e.g., a $NF_3/NH_3$ plasma), or a combination of both. The chemistries used during the pre-silicide clean may remove native oxide as well as an upper portion of the source/drain regions 292, forming a U-shaped trench 231 at the top surface of the source/drain regions 292. The U-shaped trench 231 has a bottom 237 and a sidewall 239, as shown in FIG. 6A.

Figure 7B:
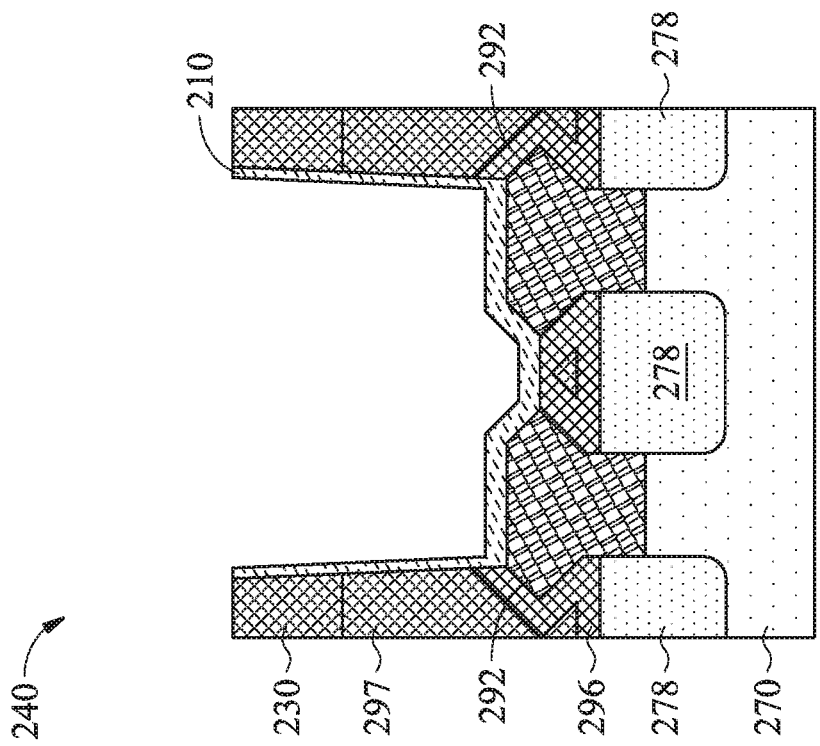
Figure 7A:
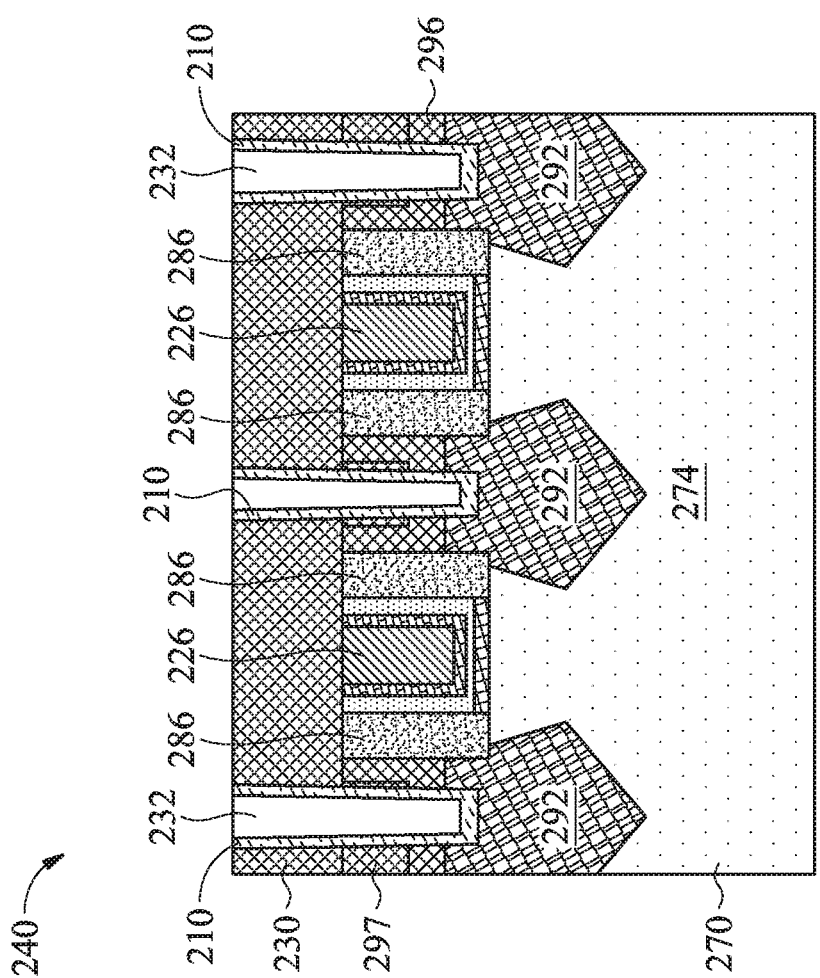

At operation 110, a conformal metal layer 210 is formed on the surfaces of the exposed source/drain regions 292 (e.g., sidewall 239 and bottom 237 of the U-shaped trench 231) and over the surfaces of the second ILD 230, the first ILD 297, and the CESL 296, as shown in FIGS. 7A and 7B. The metal layer 210 may have a thicker thickness at the bottom 237 of the U-shaped trench 231 than the thickness of the metal layer 210 on the sidewalls 239 and the surfaces of the second ILD 230, the first ILD 297 and the CESL 296. For example, the ratio of the thickness of the metal layer 210 at the bottom 237 to the thickness of the metal layer 210 on the sidewalls 239 and on the surfaces of the second ILD 230, the first ILD 297 and the CESL 296 may be in a range from about 2:1 to about 10:1, for example about 4:1 to about 6:1. The metal layer 210 may be a single layer or a multi-layer stack. In cases where a single layer is adapted for the metal layer 210, the metal layer 210 may be or include titanium, tantalum, or the like. In cases where a multi-layer stack (e.g., a bi-layer) is adapted for the metal layer 210, a first layer may be or include titanium, tantalum, or the like, and a second layer may be or include titanium nitride, titanium oxide, tantalum nitride, tantalum oxide, or the like. The first layer may be formed on the second layer, or vice versa. In either case, the first layer may have a thickness in a range from about 20 Å to about 200 Å, such as about 80 Å to about 120 Å, for example about 100 Å, while the second layer may have a thickness in a range from about 10 Å to about 70 Å, such as about 30 Å to about 50 Å, for example about 40 Å. The metal layer 210 may be deposited by ALD, PVD, CVD, or any suitable deposition technique. In some cases where a bi-layer is used, the first layer may be formed by PVD and the second layer may be formed by ALD. In some embodiments, the metal layer 210 is a Ti layer. In another embodiment, the metal layer 210 is a Ti/TiN layer stack.

Figures 8A, 8B:
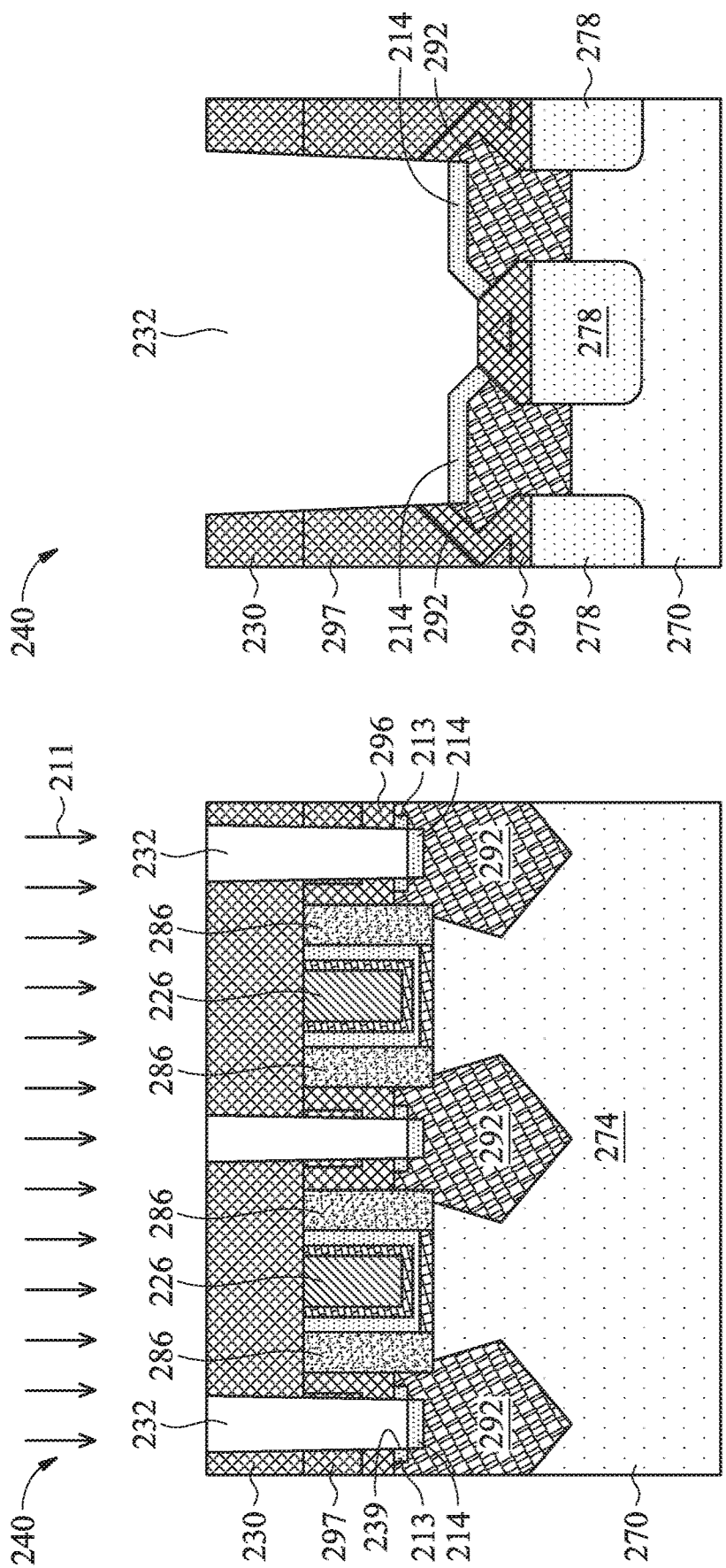
Figure 10:
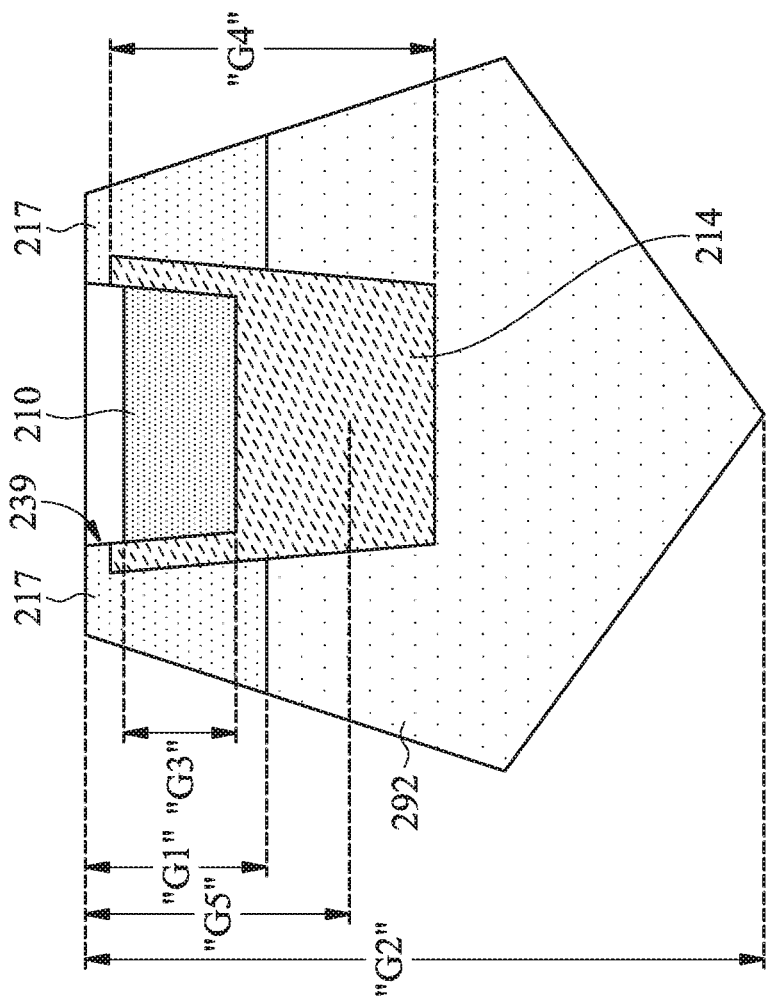
FIGS. 9 and 10 illustrate a portion of the source/drain region showing a surface nitride layer or a nitrided portion according to some embodiments.
Figure 9:
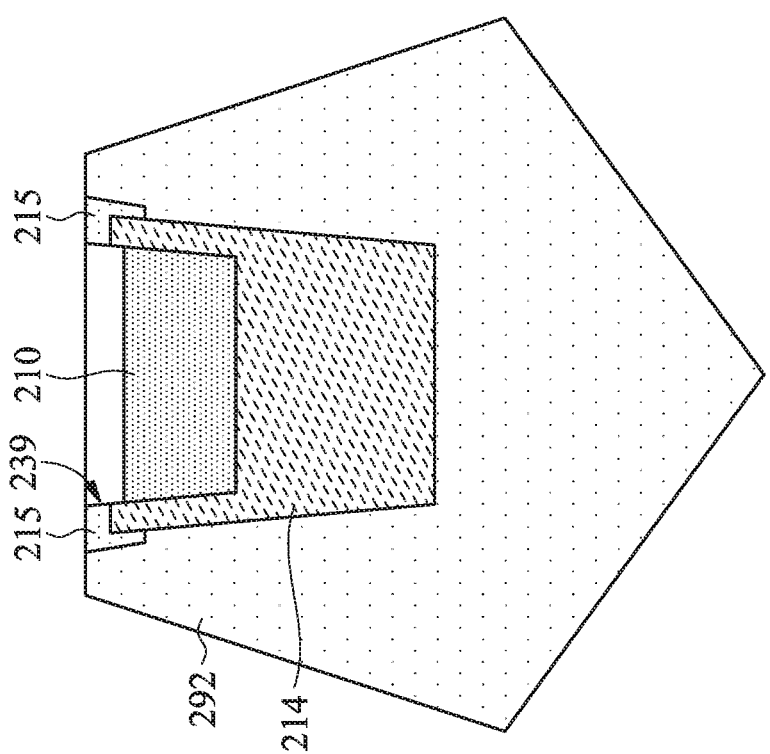

At operation 112, a silicide layer 214 is formed on the source/drain regions 292 by reacting an upper portion of the source/drain regions 292 with the metal layer 210, as shown in FIGS. 8A and 8B. The substrate 270 is then heated, for example, by subjecting to an anneal process, to cause the silicide reaction to occur wherever the metal layer 210 is in contact with the source/drain regions 292. The silicide reaction may occur at an interface between the source/drain regions 292 and the metal layer 210, and a region around and/or beyond the interface between the source/drain regions 292 and the metal layer 210. In some cases where a layer stack (e.g., Ti/TiN) is used for the metal layer 210, the bottom layer (e.g., Ti) may react with the source/drain region 292 and convert fully into a silicide layer, with a portion of the top layer (e.g., TiN) being converted into a silicide layer. The anneal process can be, for example, a rapid thermal anneal (RTA) performed at a temperature in a range from about 400° C. to about 650° C., such as about 500° C., for a duration in a range from about 10 seconds to about 60 seconds. The un-reacted metal layer 210 is then removed by a selective etch process that attacks non-reacted metal layer 210 but does not attack the silicide layer 214. As the metal layer 210 may have a thicker thickness at the bottom 237 than the thickness of the metal layer 210 over the surfaces of the sidewall 239, the second ILD 230, the first ILD 297, and the CESL 296, in some cases a portion of the un-reacted metal layer 210 (e.g., TiN in a case of Ti/TiN layer stack) may still remain on the silicide layer 214 after the selective etch process (e.g., after the un-reacted metal layers 210 have been removed from the surfaces of the second ILD 230, the first ILD 297, and the CESL 296). The metal layer 210 remaining on the silicide layer 214 may be advantageous because it can function as a barrier layer to prevent oxidation of the silicide layer 214 during subsequent processes. FIGS. 9 and 10 shows one example where the silicide layer 214 has the metal layer 210 remained thereon.

The selective etch process may be any suitable wet etch or a dry etch process. Suitable wet etch process may include using deionized water, hydrofluoric (HF) acid based etching chemistries, hydrogen peroxide ($H_2O_2$), hydrogen chloride (HCl), or a combination thereof to selectively remove the non-reacted metal layer 210. Suitable dry etch process may include using a mixture of oxygen-containing gas (such as oxygen) and fluorine-based or fluorocarbon-based etch chemistries to selectively remove the non-reacted metal layer 210. FIGS. 8A and 8B further illustrate that the metal layer 210 has been removed from the exposed surfaces of the second ILD 230, first ILD 297, and the CESL 296.

Due to high aspect ratio of the source/drain contact openings 232 (e.g., about 3:1 or above), it has been observed that the formation of the silicide layer 214 would occur notably at the bottom 237 of the U-shaped trench 231, with minimized or no formation of the silicide layer at the upper portion of the sidewalls 239. The poor coverage of the metal layer 210 at the upper portion of the sidewalls 239 can result in little or no formed silicide at the upper portion of the sidewalls 239 after annealing. In other words, the upper portion of the sidewalls 239 may not be covered by the silicide layer 214, leaving a portion of the source/drain region 292 exposed through the opening 232 after the silicide process (can be better seen in FIGS. 9 and 10). The terms "exposed source/drain regions" or "exposed surfaces of source/drain regions" used in this instance generally refer to a surface region of the source/drain regions 292 not covered by the silicide layer 214 exposed through the opening 232 or a surface region of the source/drain regions 292 that has minimized or no physical contact with the silicide layer 214 exposed through the opening 232.

The exposed source/drain regions 292 at the upper portion of the sidewalls 239 can be problematic because the contact metal subsequently filled in the source/drain contact openings 232 may diffuse through a subsequently deposited metal barrier layer (formed between the contact metal and the source/drain regions 292 after silicide process) and react with the exposed source/drain regions 292. As a result, undesired metal silicide may form at and/or near the upper portion of the sidewalls 239 that can cause reliability issues on the devices. Although a thicker metal barrier layer (e.g., 2 nm or greater) can be used to prevent the contact metal from diffusing and reacting with the exposed source/drain regions 292, it can lead to poor gap-fill capability for the subsequent contact metal. Various embodiments described below include a surface treatment which includes converting a surface layer of the source/drain regions 292 to a barrier layer. The surface treatment forms an effective metal diffusion barrier at the exposed surface of the source/drain regions without sacrificing gap-fill capability of the contact metal.

Self-Aligned Diffusion Barrier for Epitaxy Source/Drain Regions

At operation 114, the exposed source/drain regions 292 are subjected to a surface treatment 211 to form a diffusion barrier layer 213 at the surface of the exposed source/drain regions 292, as shown in FIG. 8A. The diffusion barrier layer 213 prevents the contact metal subsequently filled in the source/drain contact openings 232 from diffusing and reacting with the underlying source/drain regions 292 through the upper portion of the sidewalls 239 that are not covered by the silicide layer 214. In various embodiments, the surface treatment 211 is a nitridation process. The nitridation process may include exposing the exposed source/drain regions 292 to a nitrogen-containing plasma or a nitrogen-containing ambient environment so that nitrogen atoms chemically react with atoms residing at the exposed surface of the source/drain regions 292 to form a nitride layer or nitride region in the upper portion of the source/drain regions 292. The nitridation process thus forms a self-aligned sidewall barrier layer at the exposed surface of the source/drain regions 292. Additionally or alternatively, the nitridation process may include exposing the surface of the exposed source/drain regions 292 to nitrogen molecules, atom-form nitrogen radicals and ions to implant nitrogen into the surface of the exposed source/drain regions 292 so that the surface or a region of the upper portion of the source/drain regions 292 is reacted with nitrogen and forms nitrided source/drain regions as a result of implantation process.

FIGS. 9 and 10 are enlarged partial views of the source/drain regions 292 of FIG. 8A after the surface treatment according to embodiments. FIGS. 9 and 10 show the surface layer or the exposed region of the source/drain regions 292 has been nitrided. Particularly, the nitriding reaction occurs in the exposed source/drain regions 292 not being covered by the silicide layer 214. The depth of the nitriding reaction at the exposed source/drain regions 292 may vary depending on the application/surface treatment performed. FIG. 9 shows an embodiment where the nitrogen is diffused into the exposed surface of the source/drain regions 292 at the upper portion of the sidewall 239 of the U-shaped trench 231 and converting at least the surface layer of the source/drain regions 292 into a surface nitride layer 215. In various embodiments, the surface nitride layer 215 may have a thickness (measuring from the surface of the sidewall 239) in a range from about 0.1 nm to about 5 nm, such as about 0.5 nm to about 1.8 nm, for example about 0.8 nm to about 1.5 nm. FIG. 10 shows another embodiment where the nitrogen is diffused through the exposed surface of the source/drain regions 292 and converts the entire upper portion of the source/drain regions 292 into a nitrided portion 217 upon completion of the surface treatment. FIG. 10 further shows that the nitrogen may extend through the entire upper portion of the source/drain regions 292 (e.g., extending from the surface of the sidewall 239 to an interface between the source/drain region 292 and the gate spacer 286 shown in FIG. 8A) and propagate downwardly below a top of the silicide layer 214. The nitrided region 217 may have a dimension "G1" measuring from a top surface of the nitrided region 217 (which can be co-planar with the top of the source/drain region 292) to a bottom of the nitrided region 217. The source/drain region 292 may have a dimension "G2" measuring from the top of the source/drain region 292 to a bottom of the source/drain region 292. In various embodiments, a ratio of G1 to G2 can be in a range from about 1:3 to about 1:20, such as about 1:5 to about 1:8, for example about 1:6 to about 1:7. This ratio may vary depending upon parameters used during the nitridation process and the size of the source/drain region 292. The metal layer 210 remaining on the silicide layer 214 may have a dimension "G3" measuring from a top of the metal layer 210 to a bottom of the metal layer 210. The silicide layer 214 may have a dimension "G4" measuring from the top of the silicide layer 214 to a bottom of the silicide layer 214. In various embodiments, a ratio of G3 to G4 can be in a range from about 1:2 to about 1:6, such as about 1:3 to about 1:5, for example about 1:4. The sidewall 239 may have a dimension "G5" measuring from the top of the sidewall 239 (which can be co-planar with the source/drain region 292) to the bottom of the sidewall 239 (which can be co-planar with the bottom of the silicide layer 214). In various embodiments, a ratio of G1 to G5 can be in a range from about 1:2 to about 1:10, such as about 1:4 to about 1:8, for example about 1:5 to about 1:6. In some examples, the sidewall 239 may not necessarily extend the full depth of the silicide layer 214. A ratio of G4 to G5 can be in a range from about 1:1 to about 8:1, such as about 2:1 to about 6:1, for example about 3:1 to about 5:1. In nitrided regions (e.g., surface nitride layer 215 and/or nitride region 217), the nitrogen atomic density can be in a range from $1\times10^{21}$ cm-3 to $3\times10^{21}$ cm-3, and the nitrogen atomic percentage can be in a range from 0% to 60%.

Nitridation of the surface layer or entire upper portion of the source/drain regions 292 can be advantageous because an effective metal diffusion barrier can be formed in the exposed surface and/or within the exposed source/drain regions 292 without growing additional barriers for blocking contact metal diffusion. Therefore, the overall thickness of the barrier layer in the source/drain contact openings 232 can be reduced, which in turn can provide more space for the subsequent contact metal. As a result, the contact metal gap-fill window may be increased.

The nitridation process may be a plasma nitridation process using capacitively coupled plasma (CCP) or inductively coupled plasma (ICP). The nitrogen plasma may be generated in-situ in a process chamber in which the semiconductor substrate 270 is disposed, or in a remote plasma chamber before flowing into a process chamber in which the semiconductor substrate 270 is disposed. The exposed source/drain regions 292 may be exposed to a radio frequency (RF) plasma formed from a process gas consisting of, consisting essentially of, or comprising a nitrogen-containing gas such as $N_2$, $NH_3$, NO, $N_2O$, a combined gas of $N_2$ and $H_2$, and/or any mixtures thereof. The process chamber may be maintained at a pressure in a range from about 1 mTorr to about 20 Torr, such as about 10 mTorr to about 10 Torr, for example about 60 mTorr to about 1 Torr. An inert gas such as argon (Ar), helium or neon gas may be optionally added to the process gas. In an example, the process gas includes $N_2$ and Ar. In another example, the process gas includes $NH_3$ and Ar. In yet another example, the process gas includes $N_2$ and He. In some embodiments, the nitrogen-containing gas is flowed into the process chamber at a first volumetric flowrate, and the inert gas is flowed into the process chamber at a second volumetric flowrate, and a ratio of the first volumetric flowrate to the second volumetric flowrate can be controlled in a range from about 1:2 and about 1:10, such as about 1:3 to about 1:8, for example about 1:4 to about 1:6. For a 300 mm substrate, the nitrogen-containing gas may be supplied at a flow rate in a range from about 50 sccm to about 6000 sccm, such as about 200 sccm to about 2000 sccm, for example about 600 sccm to about 1000 sccm. If an inert gas is used, the inert gas may be supplied at a flow rate in a range from about 25 sccm to about 12000 sccm, such as about 400 sccm to about 8000 sccm, for example about 800 sccm to about 5000 sccm. Other gas composition and/or flow rates may be used depending upon the application and configuration of the process chamber. The temperature of the semiconductor substrate 270 may be maintained in a range from about 20° C. and 600° C., such as about 50° C. to about 450° C., for example about 80° C. to about 200° C. After the process gas is introduced into the process chamber, an RF source power may be coupled to the process gas to form a plasma. The RF source power may be provided at a power in a range from about 20 Watts to about 5000 Watts, such as about 50 Watts to about 1000 Watts, for example about 100 Watts to about 300 Watts. The RF source power may be provided at any suitable RF frequency ranging between 2 MHz to about 60 MHz, such as about 13.56 MHz. The plasma may be pulsed or continuously applied at up to about 1200 Watts effective power. For example, the plasma may be applied continuously at up to about 400 Watts for a duration in a range from about 10 seconds to about 300 seconds, such as about 20 seconds to about 120 seconds, for example about 40 seconds to about 90 seconds. The duration and RF source power may be adjusted to control the amount of nitrogen diffusing or incorporating into the exposed surface of the source/drain regions 292. In cases where a pulsed plasma is adapted, the plasma may be pulsed at a pulse frequency of about 2 kHz to about 20 kHz, such as about 4 kHz to about 15 kHz. The pulsed plasma may have a duty cycle in a range from about 2% to about 50%, such as about 6% to about 30%, for example about 20%, at up to 3000 Watts peak power. Likewise, the duty cycle and/or RF source power may be adjusted to control the amount of nitrogen diffusing or incorporating into the exposed surface of the source/drain regions 292. In some examples, the plasma may be pulsed at a duty cycle in a range from about 5% to 20% at up to 2000 Watts peak power.

During the plasma nitridation process, the substrate 270 may be unbiased, in which case, the ionized nitrogen species are accelerated by the plasma potential and then implanted or incorporated into the exposed surface of the source/drain regions 292. Alternatively or additionally, a bias voltage can be applied to the substrate 270 to further accelerate the ions from the plasma and implant or incorporate them deeper into the exposed surface of the source/drain regions 292. The bias voltage may also help nitrogen ions to have minimized reaction with the dielectric material of the second ILD 230, the first ILD 297 and the CESL 296. Either a direct current or a radio frequency (RF) bias voltage can be used to bias the substrate 270. The bias voltage may be provided in a range from about 10 Watts to about 500 Watts, such as about 50 Watts to about 300 Watts, for example about 100 Watts to about 250 Watts, at a frequency in a range from about 10 MHz to about 30 MHz, for example about 13.56 MHz. In some cases, nitrogen ions may be filtered or removed from the plasma so that only nitrogen-containing radicals, such as N, NH, and $NH_2$, are directed toward the exposed surface of the source/drain regions 292.

In any case, nitrogen-containing radicals and/or nitrogen ions generated from the plasma are incorporated into the exposed source/drain regions 292 to convert the surface or at least the upper portion of the source/drain regions 292 into nitrided source/drain regions, such as surface nitride layer 215 or nitride portion 217 shown in FIGS. 9 and 10. In an example where the exposed source/drain regions 292 include silicon germanium, the nitridation may convert at least a portion of the silicon germanium into nitrided silicon germanium.

While plasma nitridation process is described, the nitridation process may be accomplished by any other suitable techniques, such as thermal nitridation process, ion implantation process, or any suitable process that can produce nitrogen species/radicals. For example in some embodiments in which the thermal nitridation is performed, the semiconductor device 240 may be disposed in a thermal process chamber having a nitrogen ambient environment. The thermal process chamber may be a furnace or a rapid thermal process chamber. The nitrogen ambient may be formed by supplying a process gas consisting of, consisting essentially of, or comprising a nitrogen-containing gas such as $N_2$, $NH_3$, NO, $N_2O$, a combined gas of $N_2$ and $H_2$, and/or any mixtures thereof. The temperature within the thermal process chamber may be maintained between about 650° C. and about 1200° C., such as about 750° C. to about 1000° C. In one example where the exposed source/drain regions 292 include silicon germanium, the thermal nitridation may convert at least a portion of the silicon germanium into nitrided silicon germanium.

In yet another embodiment in which an ion implantation process is performed, nitrogen ions may be implanted into the exposed surfaces of the source/drain regions 292 to form a nitride layer, for example a nitrided silicon germanium layer, at the surface of the exposed source/drain regions 292. During the ion implantation process, a process gas consisting of, consisting essentially of, or comprising a nitrogen-containing gas such as $N_2$, $NH_3$, NO, $N_2O$, a combined gas of $N_2$ and $H_2$, and/or any mixtures thereof that can form nitrogen ions is supplied into a process chamber in which the semiconductor substrate 270 is disposed. The process gas is then energized to form nitrogen ions that are implanted into the exposed source/drain regions 292. The nitrogen ions may be implanted with an ion implantation energy of about 5 eV to about 650 eV, such as about 20 eV to about 250 eV, for example about 50 eV to about 150 eV.

Figures 11A, 11B:
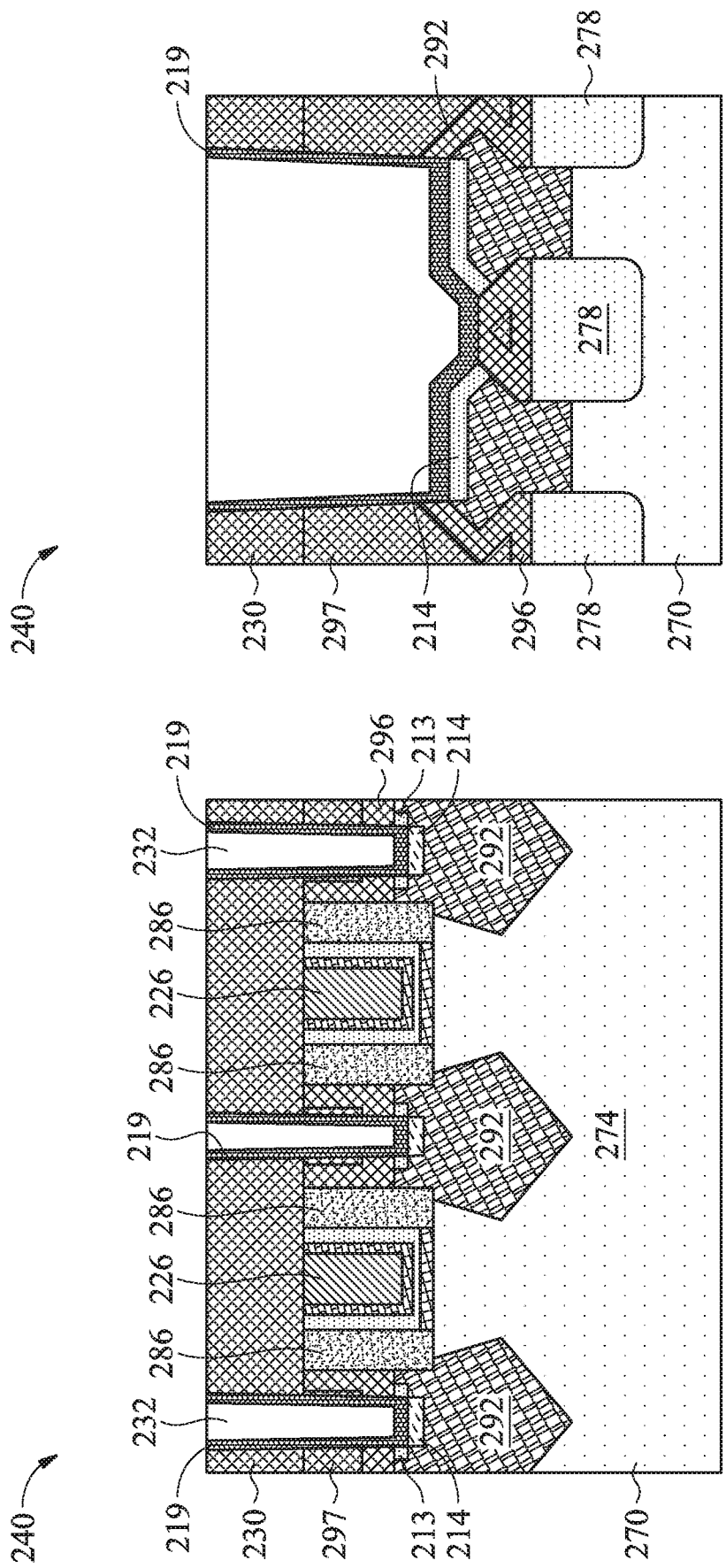
Figures 12A, 12B:
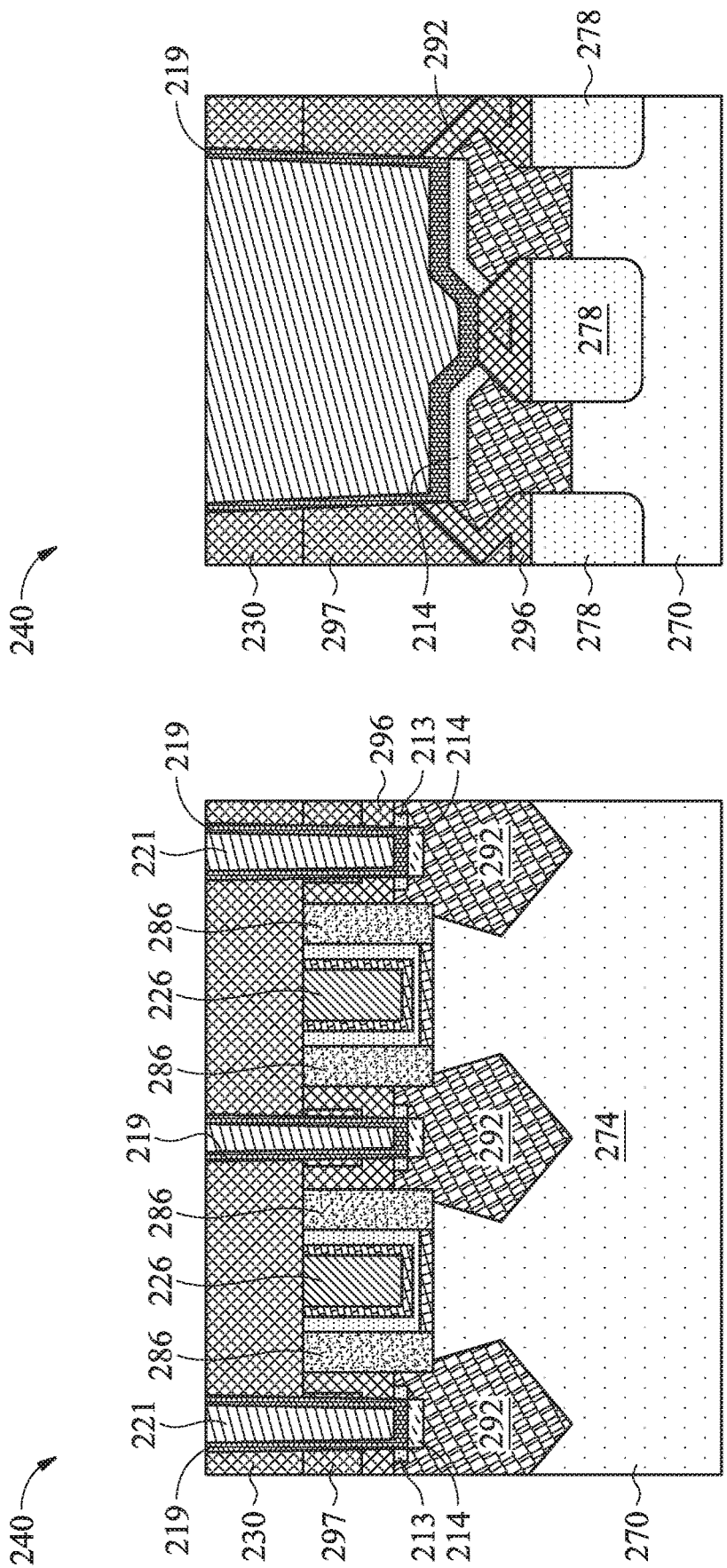

At operation 116, optionally, a barrier layer 219 is conformally deposited in the source/drain contact openings 232 on the silicide layer 214, on exposed surfaces of the diffusion barrier layer 213 (e.g., nitride layer 215, 217 shown in FIGS. 9 and 10) and over the second ILD 230, the first ILD 297, and the CESL 296, as shown in FIGS. 11A and 11B. The barrier layer 219 may have a thickness in a range from about 2 nm or less, such about 1.9 nm or less, for example about 1.6 nm. In some embodiments, the barrier layer 219 has a thickness in a range from about 1.39 nm to about 1.87 nm. The barrier layer 219 may be or include titanium nitride, titanium oxide, tantalum nitride, tantalum oxide, any suitable transition metal nitrides or oxides, the like, or any combination thereof, and may be deposited by ALD, CVD, PECVD, HDP-CVD, low-pressure CVD (LPCVD), or physical vapor deposition (PVD), or any suitable deposition technique. In an example, the barrier layer is TiN deposited by ALD.

Since the diffusion barrier layer 213 (e.g., surface nitride layer 215 or nitride portion 217 shown in FIGS. 9 and 10) is formed in the surface region and/or within the exposed source/drain regions 292, the barrier layer 219 can be formed at a thinner thickness as compared to the case where a conventional barrier layer is formed onto the exposed source/drain regions 292 without the diffusion barrier layer (e.g., diffusion barrier layer 213) disposed in between. For example, the barrier layer 219 may be formed at a thickness that is about 18% to about 23% thinner, for example about 20% thinner, than the convention barrier layer. The barrier layer 219 and the diffusion barrier 213 formed at the exposed surfaces of the source/drain regions 292 together can provide an effective barrier at the upper portion of the source/drain regions 292 (e.g., the upper portion of the sidewall 239 of the U-shaped trench 231) to prevent the contact metal subsequently filled in the source/drain contact openings 232 from diffusing through the barrier layer 219 and reacting with the underlying source/drain regions 292 to form any undesired metal silicide that would otherwise cause reliability issue to the devices. The barrier layer 219 and the diffusion barrier 213 can demonstrate good barrier properties while keeping the overall thickness of the barrier layer to less than 2 nm, which can ensure good gap-fill capability for the subsequently deposited metal contact. Furthermore, the diffusion barrier layer 213 (e.g., nitride layer 215 or 217 shown in FIGS. 9 and 10) containing nitrogen can ensure the layer subsequently deposited on the nitride surface of the source/drain regions 292 can have a superior conformality, allowing minimized impacts on the gap-filling performance of the layers subsequently deposited in the source/drain contact openings 232. In cases where the subsequent barrier layer 219 is deposited by ALD, the diffusion barrier layer 213 containing nitrogen can promote the chemical reaction with one or more precursors of the ALD for forming the barrier layer 219 (e.g., transition metal nitrides such as TiN), thereby reducing the incubation time of the barrier layer 219 on the diffusion barrier layer 213.

At operation 118, a conductive material 221 (e.g., contact metal) can be deposited on the barrier layer 219 (if implemented) and fills the source/drain contact openings 232. The conductive material 221 may be or include cobalt, tungsten, copper, ruthenium, aluminum, gold, silver, alloys thereof, the like, or a combination thereof, and may be deposited by CVD, ALD, PVD, ECP or any suitable deposition technique. After the conductive material 221 is deposited, excess conductive material 221 and barrier layer 219 may be removed by using a planarization process, such as a CMP, for example. The planarization process may remove excess conductive material 221 and barrier layer 219 from above a top surface of the first ILD 297. Hence, top surfaces of the conductive material 221, the barrier layer 219, and the first ILD 297 may be coplanar.

Figure 13:
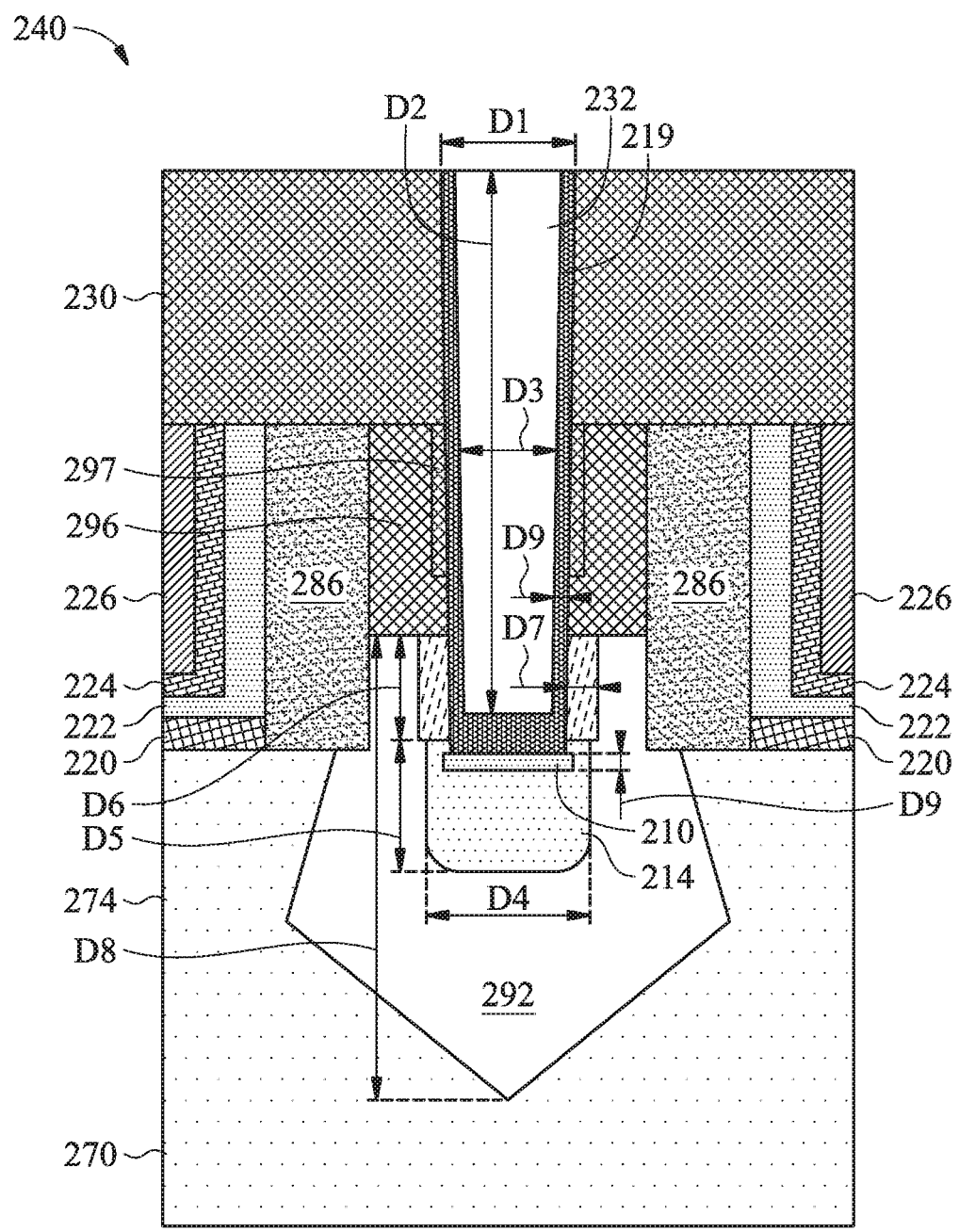
FIG. 13 illustrates a portion of the cross-sectional view of FIG. 8A to further illustrate additional details in accordance with some embodiments.

FIG. 13 illustrates a portion of the cross-sectional view of FIG. 8A to further illustrate additional details in accordance with some embodiments. The source/drain contact opening 232 through the second ILD 230, first ILD 297, and CESL 296 to the source/drain region 292 has a first dimension D1 in a plane of the top surface of the second ILD 230 and in a direction extending perpendicularly from one replacement gate structure to a neighboring replacement gate structure. The source/drain contact opening 232 also has a second dimension D2 from the plane of the top surface of the second ILD 230 to a top surface of the source/drain region 292. The source/drain contact opening 232 further has a third dimension D3 along the top surface of the source/drain region 292 and in a direction extending perpendicularly from one replacement gate structure to a neighboring replacement gate structure. The first dimension D1 can be in a range from about 10 nm to about 30 nm; the second dimension D2 can be in a range from about 30 nm to about 100 nm; and the third dimension D3 can be in a range from about 8 nm to about 30 nm. A ratio of the second dimension D2 to the first dimension D1 (e.g., an aspect ratio) can be greater than 2, such as in a range from about 3 to about 10. A ratio of the second dimension D2 to the third dimension D3 can be in a range from about 2 to about 10.

The silicide layer 214 extends laterally a fourth dimension D4 along the top surface of the source/drain region 292 and in a direction extending perpendicularly from one replacement gate structure to a neighboring replacement gate structure. The silicide layer 214 extends a fifth dimension D5 from a top surface of the silicide layer 214 to a bottom surface of the silicide layer 214. The diffusion barrier layer 213 has a sixth dimension D6 from the top surface of the source/drain region 292 to the top surface of the silicide layer 214. The diffusion barrier layer 213 extends a seventh dimension D7 from a sidewall surface of the source/drain region 292 into the source/drain region 292. The source/drain region 292 has an eighth dimension D8 measuring from the top surface of the source/drain region 292 to a bottom of the source/drain region 292. The fourth dimension D4 can be in a range from about 8 nm to about 40 nm; the fifth dimension D5 can be in a range from about 3 nm to about 20 nm; the sixth dimension D6 can be in a range from about 0.5 nm to about 10 nm; the seventh dimension D7 can be in a range from about 0.1 nm to about 5 nm, such as about 0.2 nm to about 3 nm, for example about 1 nm; the eighth dimension D8 can be in a range from about 20 nm to about 70 nm; and the ninth dimension D9 can be in a range from about 1 nm to about 6 nm, such as about 1 nm to about 4 nm, for example 3 nm. A ratio of the fourth dimension D4 to the third dimension D3 can be greater than 1, such as in a range from about 1 to about 1.3. A ratio of the fourth dimension D4 to the fifth dimension D5 can be greater than 1, such as in a range from about 1 to about 5. A ratio of the sixth dimension D6 to the seventh dimension D7 can be greater than 1, such as in a range from about 1 to 3. A ratio of the fourth dimension D4 to the seventh dimension D7 can be greater than 3, such as in a range from about 5 to 20, for example about 8 to 12. A ratio of the sixth dimension D6 to the eighth dimension D8 can be less than about 0.8, such as in a range from about 0.1 to about 0.6, for example about 0.3 to about 0.5. A ratio of the ninth dimension D9 to the seventh dimension D7 can be greater than 1, such as in a range from about 2 to 15, for example about 12. In some examples, the seventh dimension D7 may be extended laterally into the source/drain region 292 to an edge of the source/drain region 292 (e.g., the interface between the source/drain region 292 and the gate spacer 286) is reached. The metal layer 210 remaining on the silicide layer may have a dimension "D9" measuring from a top of the metal layer 210 to a bottom of the metal layer 210. In some examples, a ratio of D9 to D5 can be in a range from about 1:2 to about 1:6, such as about 1:3 to about 1:5, for example about 1:4.

The semiconductor device 240 fabricated according to the flow chart 100 may undergo further processing to form various features and regions. For example, subsequent processing may form various contacts/vias/lines and multilayers of interconnect features (e.g., metal layers and interlayer or intermetal dielectrics) on the substrate 270 including the semiconductor device 240, configured to connect the various features to form a functional circuit that may include one or more devices (e.g., one or more semiconductor devices 240). The various interconnection features may employ various conductive materials including copper, tungsten, and/or silicide. In one example, a damascene and/or dual damascene process may be used to form a copper related multilayer interconnection structure. Furthermore, additional process steps may be implemented before, during, and after the flow chart 100, and some operations described above may be replaced or eliminated depending upon the application.

Plasma Treatment for Oxide Removal and Passivation of Oxidized Metal Barrier

As described previously at operation 112, a selective etch process is used to remove un-reacted metal layer 210 left in the source/drain contact openings 232. However, the metal layer 210 may have a thicker thickness at the bottom 237 and a thinner thickness over the surfaces of the sidewall 239, the second ILD 230, the first ILD 297, and the CESL 296 due to the high aspect ratio of the source/drain contact openings 232. Therefore, in some cases a portion of the un-reacted metal layer 210 (e.g., TiN in a case of Ti/TiN layer stack) may still remain on the silicide layer 214 after full removal of the un-reacted metal layer 210 from the surfaces of the sidewall 239, the second ILD 230, the first ILD 297, and the CESL 296. While the un-reacted metal layer 210 remaining on the silicide layer 214 can function as a barrier layer to prevent oxidation of the silicide layer 214, it has been observed that various processes between (and/or during) the silicidation process and the contact metal formation may cause this barrier layer to be heavily oxidized. For example, in cases where a bi-layer metal layer 210 (e.g., a Ti/TiN layer stack) is used, the selective etch process may remove a surface portion of the TiN layer while the bottom TiN layer (and in some cases the underlying Ti layer) remain intact. The TiN layer, particularly the surface layer of TiN, remaining on the silicide layer 214 may be heavily oxidized due to exposure to the etchant(s) used during the selective etch process (for removing the un-reacted metal layer 210 as described previously at operation 112) and/or the precursor(s) used during re-deposition of the barrier layer 219 (e.g., when a barrier layer 219 using transition metal oxides is used as described previously at operation 116). The heavily oxidized barrier layer on the silicide layer 214 can cause the contact resistance at the silicide layer/contact metal region to increase dramatically. As a result, the reliability of the device is degraded or compromised.

Figure 14:
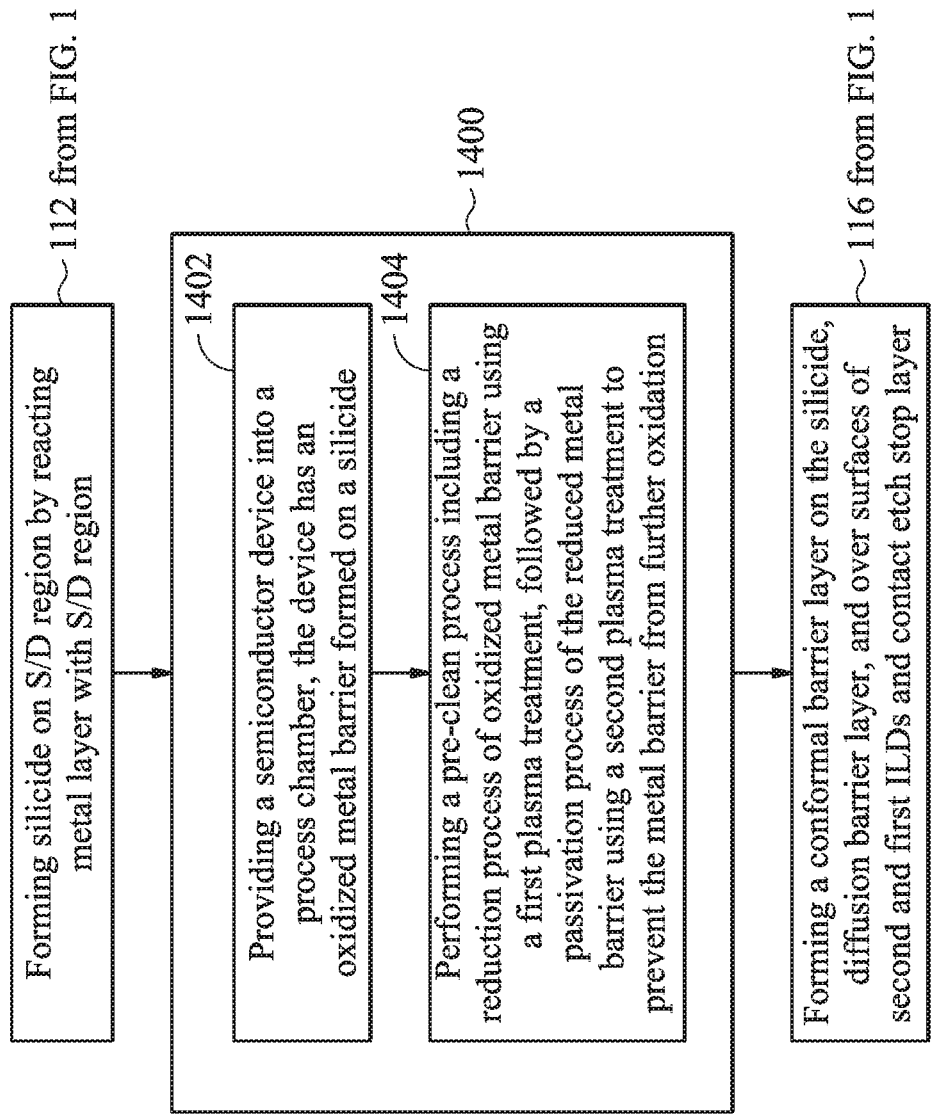
FIG. 14 is a flow chart illustrating an example method for processing a semiconductor device according to some embodiments.
Figure 15:
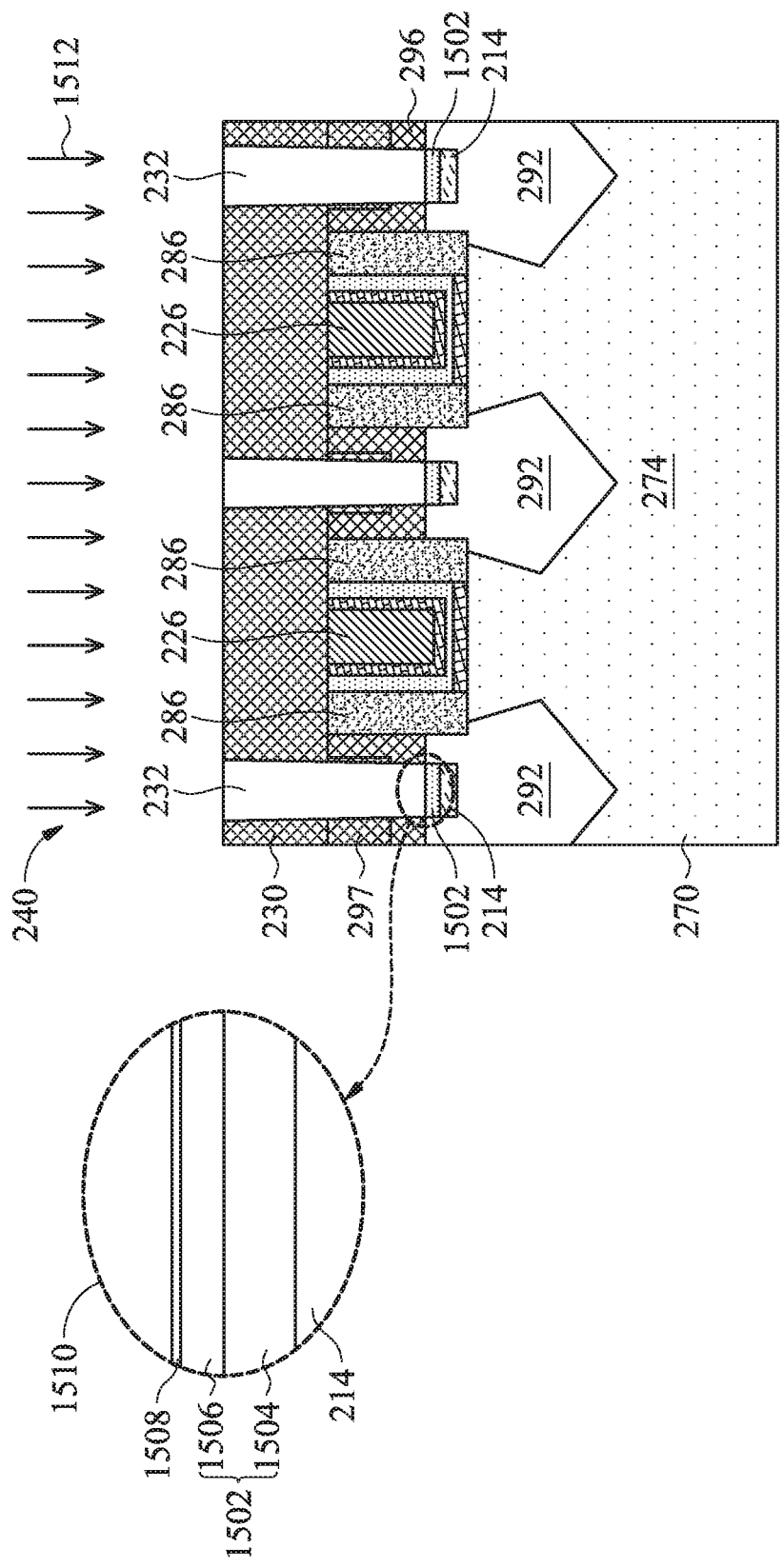
FIGS. 15 and 16 are schematic cross-sectional views of a portion of the semiconductor device corresponding to various stages of fabrication according to the flow chart of FIG. 14 according to some embodiments.
Figure 16:
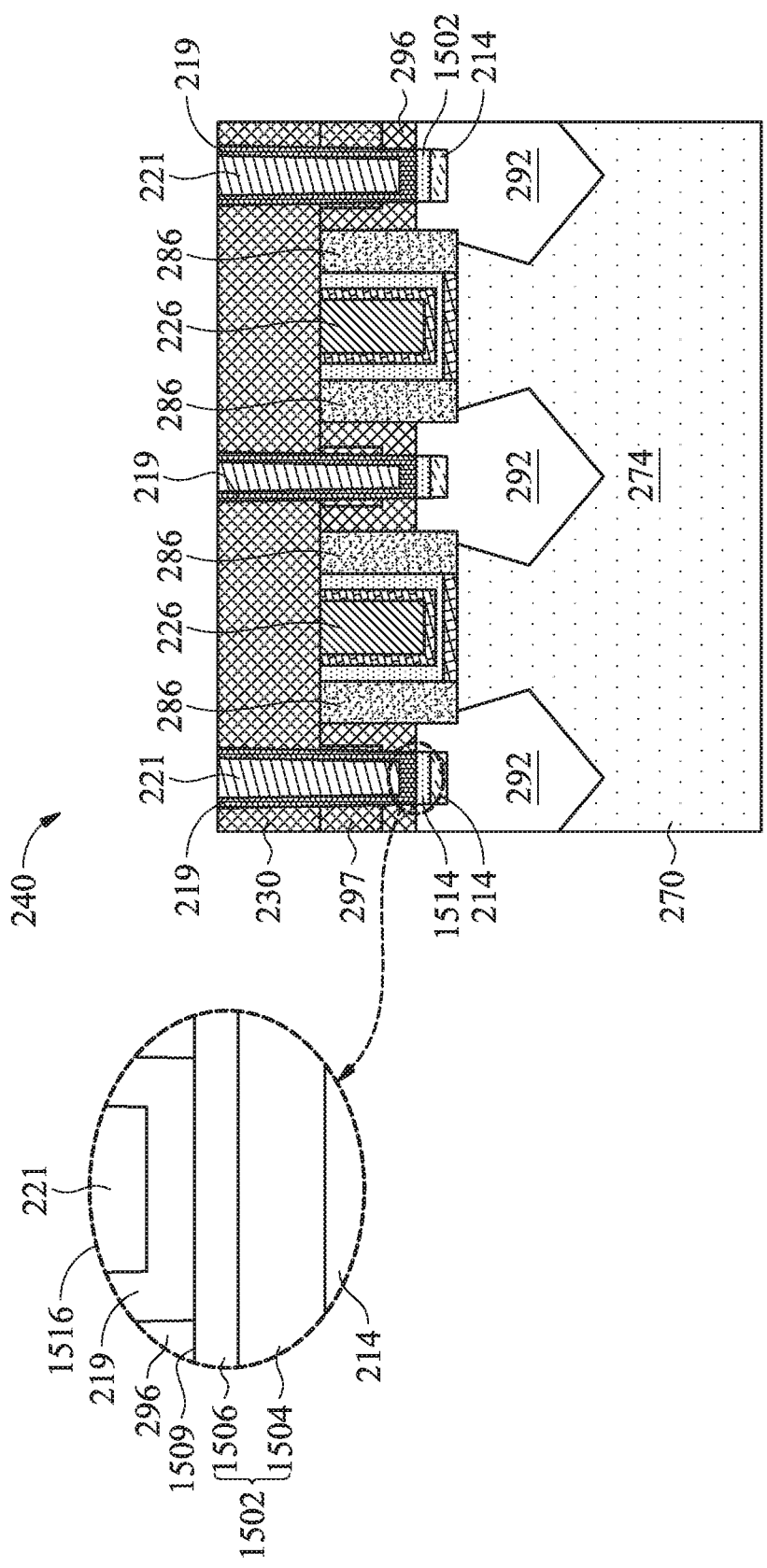

Various embodiments described below provide an efficient, damage-free method for removal of the oxides from a barrier layer formed on a silicide layer. Particularly, the barrier layer is restored to its original states and then treated to allow the initial barrier layer to be re-used. FIG. 14 is a flow chart 1400 illustrating an example method for processing a semiconductor device (e.g., the semiconductor device 240) according to various embodiments. FIGS. 15 and 16 are schematic cross-sectional views (along the channel direction) of a portion of the semiconductor device 240 corresponding to various stages of fabrication according to the flow chart of FIG. 14.

The flow chart 1400 begins at operation 1402 by providing a semiconductor device, such as the semiconductor device 240, into a process chamber, such as CVD chamber, a PECVD chamber, or any suitable plasma chamber. FIG. 15 illustrates the semiconductor device 240 in an intermediate stage between the silicide formation (operation 112) and the surface treatment (operation 114). The semiconductor device 240 shown in FIG. 15 is substantially identical to the semiconductor device 240 shown in FIG. 8A except that the silicide layer 214 has a heavily oxidized barrier layer 1502 formed thereon. As described above, the barrier layer 1502 may be heavily oxidized due to exposure of the metal layer 210 to etchant(s) and precursor(s) used during a selective etch process (at operation 112) and/or a re-deposition of the barrier layer 219 (operation 116). The metal layer 210, as described previously, can be a bi-layer in which a first layer may be or include titanium, tantalum, or the like, and a second layer may be or include titanium nitride, titanium oxide, tantalum nitride, tantalum oxide, or the like. In the example illustrated in FIG. 15, the heavily oxidized barrier layer 1502 includes a first layer 1504 of Ti and a second layer 1506 of TiN. In some examples, the first layer 1504 may not be present between the silicide layer 214 and the second layer 1506; for example, the silicidation process may consume all of the first layer 1504 at the source/drain region 292 to form the silicide layer 214. Inset 1510 in FIG. 15 is an enlarged partial view showing the first layer 1504 of Ti is disposed between the silicide layer 214 and the second layer 1506 of TiN, wherein the second layer 1506 of TiN has an oxidized surface layer 1508 formed due to heavy oxidation of the second layer 1506. While titanium is described herein, the concept may be equally applicable to any metal or dielectric material.

At operation 1404, the semiconductor device 240 is subjected to a pre-clean process 1512 in the process chamber. The pre-clean process 1512 may include a reduction process of metal barrier oxides using a first plasma treatment, followed by a passivation process of the reduced metal barrier using a second plasma treatment to prevent the metal barrier from further oxidation. During the reduction process, a reducing agent may be introduced into a vacuum chamber and a frequency power is coupled to the reducing agent to initiate a plasma. The plasma excites the reducing agent into an energized ionic state. The energized ions chemically react with the metal oxide to remove oxygen from the oxidized surface layer 1508, reducing the metal oxide to metal.

In various embodiments, the reducing agent may be atomic hydrogen (H) (e.g., normal hydrogen ($H_2$) that has been dissociated to its atoms), hydrogen radicals, and/or energetically excited neutral species of hydrogen, which may be generated from a hydrogen-containing gas in-situ or in a remote plasma reactor separated from the process chamber in which the semiconductor device 240 is disposed. Suitable hydrogen-containing gas may include $H_2$, $NH_3$, hydrazine ($N_2H_4$), or any combinations thereof.

In cases where the second layer 1506 is TiN, the oxide surface layer 1508 may have Ti—O—N bonds and/or TiO bonds in the surface portion of the crystal lattice. During the first plasma treatment, the energized ions, radicals and/or neutral species of hydrogen from the reducing agent can chemically react with the oxidized surface layer 1508 by breaking Ti—O—N bonds and/or Ti—O bonds in the surface portion of the oxidized surface layer 1508. Oxygen that is being pushed away from the oxidized surface layer 1508 react with the hydrogen to produce water as a by-product, leaving oxygen vacancies in the crystal lattice. The first plasma treatment allows removal of the oxygen without damaging the crystal lattice of the surface portion of the barrier layer 1502. Therefore, the crystal lattice (and thus the thickness) of the barrier layer can be preserved.

After the oxide surface layer 1508 has been reduced, the semiconductor device 240 may be subjected to a second plasma treatment, such as a nitrogen plasma, to incorporate nitrogen at oxygen vacancies due to removal of oxygen from the crystal lattice. Nitrogen bonds with titanium to form TiN in the surface of the barrier layer 1502. As a result, the surface portion of the barrier layer 1502 can be restored back to its original condition (e.g., TiN). The nitrogen plasma also passivates the surface of the barrier layer 1502 with nitrogen to prevent re-oxidation of the barrier layer 1502 during the following processes. The nitrogen plasma may be formed from a nitrogen-containing gas in-situ or in a remote plasma reactor separated from the process chamber in which the semiconductor device 240 is disposed. Suitable nitrogen-containing gas may include $N_2$, $NH_3$, or a combination thereof.

Instead of employing two different plasma treatments, in some embodiments the pre-clean process 1512 is a single plasma treatment using a reaction agent containing hydrogen and nitrogen to allow chemical reduction, restoration, and passivation of the oxidized surface layer 1508 during the pre-clean process. In such a case, the reaction agent may be a gas or gas mixture of one or more of hydrogen-containing gas and/or nitrogen-containing gas described above. In some embodiments, the reaction agent is $NH_3$. In some embodiments, the reaction agent is $H_2+N_2$. In some embodiments, the reaction agent is $H_2+NH_3$. In some embodiments, the reaction agent is $N_2+NH_3$. In some embodiments, the reaction agent is $H_2$. In some embodiments, the reaction agent is $N_2$.

In either case, the substrate 270 may be unbiased, in which case the ionized hydrogen and/or nitrogen species are accelerated by the plasma potential and then incorporated into the oxidized surface layer 1508 during the pre-clean process 1512. Alternatively or additionally, a bias voltage can be applied to the substrate 270 to further accelerate the ions from the plasma and implant or incorporate them deeper into the oxidized surface layer 1508. The bias voltage may also help hydrogen and/or nitrogen ions to have minimized reaction with the dielectric material of the second ILD 230, the first ILD 297 and the CESL 296. Either a direct current or a radio frequency (RF) bias voltage can be used to bias the substrate 270. If desired, the pre-clean process may be performed in one or more treatment cycles and purged between cycles.

Exemplary process parameters for at least some embodiments, using $H_2+N_2$ to reduce the oxide surface layer 1508 (e.g., $TiO_2$), include a substrate temperature being maintained in a range from about room temperature to about 450° C., such as about 150° C. to about 350° C., for example about 200° C., and a chamber pressure being maintained in a range from about 1 mTorr to about 10 Torr, such as about 1.5 mTorr to about 10 mTorr, for example about 2 mTorr to about 5 mTorr. Plasma may be generated by applying power from a dual-frequency RF power source where a first RF power with a frequency in a range from about 1 MHz and about 60 MHz. for example about 13.56 MHz, at a power in a range from about 200 Watts to about 1000 Watts, such as about 600 Watts to about 950 Watts, for example about 900 Watts, and a second RF power with a frequency in a range from about 10 KHz to about 20 MHz, for example 100 KHz to about 500 KHz, at a power in a range from about 1 Watt to about 200 Watts, for example about 150 Watts. The plasma may have a power density in a range from about 1 Watts/cm2 to about 10 Watts/cm2, such as about 2 Watts/cm2 to about 8 Watts/cm2, for example about 4 Watts/cm2 to about 6 Watts/cm2. The bias voltage may be provided in a range from about 10 Watts to about 500 Watts, such as about 50 Watts to about 300 Watts, for example about 100 Watts to about 250 Watts, at a frequency in a range from about 10 MHz to about 30 MHz, for example about 13.56 MHz. Electrode spacing, e.g., the distance between a substrate and a showerhead, may be in a range from about 200 mils to about 1000 mils, for example from about 280 mils to about 300 mils spacing. The hydrogen gas may be provided into the process chamber at a first flow rate in a range from about 100 sccm to about 12000 sccm, and the nitrogen gas may be provided into the process chamber at a second flow rate in a range from about 100 sccm to about 8000 sccm. The ratio of the first flow rate to the second flow rate can be controlled in a range from about 1:1 to about 6:1, such as about 2.5:1 to about 5:1, for example about 3:1 to about 4:1. Additionally, carrier gases may be used in conjunction with the above process parameters to assist in stabilizing the gas flow and the plasma reaction. The flow rate of the carrier gases, such as helium, argon, and nitrogen, could be in a range from approximately 0 sccm to 2000 sccm. The pre-clean process may be performed for a duration in a range from about 25 seconds to about 180 seconds, such as about 50 seconds to about 80 seconds, for example about 60 seconds to about 70 seconds. It is contemplated that these parameters can be adjusted depending upon the application, configuration of the process chamber, and the materials to be treated.

Regardless of whether the pre-clean process 1512 is a one-step or two-step plasma treatments, the oxidized surface layer 1508 is reduced, treated, or otherwise modified and restored to its original condition (e.g., TiN) after the pre-clean process 1512. The treated barrier layer 1502 has minimized oxygen content in the surface of the barrier layer 1502. For example, it has been observed that a surface oxygen concentration of the treated barrier layer (e.g., passivated surface 1509 of the barrier layer 1514 shown in FIG. 16) measured using X-ray photoelectron spectroscopy (XPS) technique can be reduced to 6% or below, such as about 3% or below after the pre-clean process. For example, when a reaction agent of $H_2+N_2$ is used as a reaction agent during the pre-clean process, the surface oxygen concentration can be reduced to 2.42%. When a reaction agent of $NH_3$ is used as a reaction agent during the pre-clean process, the surface oxygen concentration can be reduced to 2.48%. When a reaction agent of $H_2$ is used as a reaction agent during the pre-clean process, the surface oxygen concentration can be reduced to 5.76%. When a reaction agent of $N_2$ is used as a reaction agent during the pre-clean process, the surface oxygen concentration can be reduced to 3.45%. In any case, contact resistance at the interface region of the silicide layer and contact metal is reduced and the reliability of the device is improved.

The processes described in the flow chart 1400 may be incorporated into the flow chart 100 and can be performed in any desired sequence or combination. For example, the processes described in the flow chart 1400 may be performed between operations 112 and 114. In some embodiments, the surface treatment as described at operation 114 may be omitted or excluded. That is, after operation 112, the processes described in the flow chart 1400 may be performed, followed by operation 116. FIG. 16 illustrates one example of the semiconductor device 240 where a barrier layer and a conductive material, such as the barrier layer 219 and conductive material 221, are sequentially formed on a treated barrier layer 1514, which is a TiN layer or Ti/TiN layer stack. Inset 1516 in FIG. 16 is enlarged partial view showing the first layer 1504 of Ti is disposed between the silicide layer 214 and the second layer 1506 of TiN, wherein the second layer 1506 of TiN has been treated with the pre-clean process described in the flow chart 1400. In this example, a diffusion barrier layer (e.g., the diffusion barrier layer 213 described at operation 114) is not provided at the surface of the exposed source/drain regions 292. The second layer 1506 (e.g., reduced barrier layer) thus has a treated or passivated surface 1509. While the first layer 1504 is shown in FIG. 16, in some cases the first layer 1504 may not be present between the silicide layer 214 and the second layer 1506; for example, the silicidation process may consume all of the first layer 1504 at the source/drain region 292 to form the silicide layer 214.

Various embodiments described herein may offer several advantages. It will be understood that not all advantages have been necessarily described herein, no particular advantage is required for any embodiment, and other embodiments may offer different advantages. As an example, embodiments described herein include methods and structures directed to a surface treatment process which forms an effective metal diffusion barrier at the surface of exposed source/drain regions by nitriding the exposed source/drain regions, and forming a barrier layer on the nitrided regions to prevent a contact metal subsequently filled in the source/drain contact openings from diffusing through the barrier layer and reacting with the underlying source/drain regions to form undesired metal silicide that would otherwise cause reliability issue to the devices. The barrier layer and the metal diffusion barrier demonstrate good barrier properties while keeping the overall thickness of the barrier layer to less than 2 nm, which ensures good gap-fill capability for the subsequent deposited metal contact.

As another example, embodiments described herein include methods directed to a pre-clean process which includes a reduction process of metal barrier oxides using a first plasma treatment, followed by a passivation process of the reduced metal barrier using a second plasma treatment to prevent the metal barrier from further oxidation. The pre-clean process allows removal of the oxygen from the metal barrier oxides without damaging the crystal lattice of the surface portion of the metal barrier. Therefore, the thickness of the barrier layer is preserved. Particularly, the contact resistance at the interface of the silicide and subsequently deposited contact metal is reduced. Less oxidation and purified interface also enhance silicide/contact adhesion for better reliability.

In an embodiment, a structure is provided. The structure includes an active area on a substrate, the active area comprising a source/drain region, the source/drain region having a sidewall and a lateral surface extending laterally from the sidewall of the source/drain region, the source/drain region further including a nitrided region extending laterally from the sidewall of the source/drain region into the source/drain region, a dielectric layer over the active area and having a sidewall aligned with the sidewall of the source/drain region, and a conductive feature along the sidewall of the dielectric layer to the source/drain region, the conductive feature comprising a silicide region along the lateral surface of the source/drain region and along at least a portion of the sidewall of the source/drain region.

In another embodiment, a method is provided. The method includes forming a source/drain region in an active area on a substrate, forming a dielectric layer over the active area, forming an opening through the dielectric layer, the opening extending into the source/drain region to form a trench in the source/drain region, and a bottom surface and sidewall at least partially defining the trench, forming a silicide region at the bottom surface of the trench, nitriding at least a portion of the source/drain region through the sidewall of the trench, and filling the opening with a conductive material.

In another embodiment, a method is provided. The method includes forming a source/drain region in an active area on a substrate, forming a metal silicide on a surface of the source/drain region by reacting a metal barrier layer formed on the surface of the source/drain region with the source/drain region, the metal barrier layer having a metal oxide at a surface of the metal barrier layer, and subjecting the metal barrier layer to a pre-clean process comprising a reduction process of the metal oxide and a passivation process of the reduced metal barrier.

In yet another embodiment, a structure is provided. The structure includes an active area on a substrate, the active area comprising a source/drain region, a dielectric layer over the active area, and a conductive feature through the dielectric layer to the source/drain region, the conductive feature comprising a silicide region at a surface of the source/drain region, a first barrier layer formed on the silicide region, the first barrier layer comprising a transition metal-nitride layer over the silicide region, a second barrier layer over the first barrier layer, wherein an interface between the first barrier layer and the second barrier layer has a surface oxygen concentration of 3% or below, and a conductive material on and contacting the second barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
an active area on a substrate, the active area comprising a source/drain region, the source/drain region having a sidewall and a lateral surface extending laterally from the sidewall of the source/drain region, the source/drain region further including a nitrided region extending laterally from the sidewall of the source/drain region into the source/drain region;
a dielectric layer over the active area and having a sidewall aligned with the sidewall of the source/drain region; and
a conductive feature along the sidewall of the dielectric layer to the source/drain region, the conductive feature comprising a silicide region along the lateral surface of the source/drain region and along at least a portion of the sidewall of the source/drain region.

2. The structure of claim 1, wherein the conductive feature further comprises:
a barrier layer formed on the silicide region, wherein the barrier layer comprises a transition metal nitride or a transition metal oxide.

3. The structure of claim 2, wherein the barrier layer comprises a first sub-layer and a second sub-layer on the first sub-layer, wherein the first sub-layer comprises a transition metal and the second sub-layer comprises a transition metal nitride or a transition metal oxide.

4. The structure of claim 2, wherein the conductive feature further comprises:
a conductive material formed on the barrier layer, the barrier layer being in physical contact with the conductive material.

5. The structure of claim 2, wherein the nitrided region has a first thickness and the barrier layer has a second thickness, and a ratio of the first thickness to the second thickness is in a range from 1:2 to 1:15.

6. The structure of claim 1, wherein the nitrided region has a first dimension measuring from a top surface of the source/drain region to a top surface of the silicide region, and the source/drain region has a second dimension measuring from the top surface of the source/drain region to a bottom of the source/drain region, and a ratio of the first dimension to the second dimension is in a range from 0.1 to 0.6.

7. A structure comprising:
an active area on a substrate, the active area comprising a source/drain region;
a dielectric layer over the active area; and
a conductive feature through the dielectric layer to the source/drain region, the conductive feature comprising:
a silicide region at a surface of the source/drain region;
a first barrier layer formed on the silicide region, the first barrier layer comprising a transition metal-nitride layer over the silicide region;
a second barrier layer over the first barrier layer, wherein an interface between the first barrier layer and the second barrier layer has a surface oxygen concentration of 3% or below; and
a conductive material on and contacting the second barrier layer.

8. The structure of claim 7, wherein the transition metal-nitride layer is TiN or TaN.

9. The structure of claim 7, wherein the second barrier layer is TiN, TaN, or a combination thereof.

10. The structure of claim 7, wherein the first barrier layer further comprises a second transition metal layer over the silicide region and disposed between the silicide region and the transition metal-nitride layer.

11. The structure of claim 10, wherein the second transition metal layer is Ti or Ta.

12. The structure of claim 7, wherein the silicide region is recessed below a top surface of the active area, and wherein the active area comprises a nitride region along sidewalls of the active area extending from the silicide region to an upper surface of the active area.

13. The structure of claim 12, wherein the nitride region extends along a sidewall of the silicide region.

14. A structure comprising:
- a semiconductor region, the semiconductor region comprising a first semiconductor material;
- a silicide region on the semiconductor region, the silicide region comprising a silicide of the first semiconductor material;
- a metal layer on the silicide region, the metal layer comprising a first metal, wherein the silicide region comprises a silicide of the first metal;
- a nitride layer along sidewalls of the semiconductor region, the nitride layer extending from the silicide region to an upper surface of the semiconductor region; and
- a conductive feature over the metal layer, wherein the conductive feature extends higher than an uppermost surface of the nitride layer in a cross-sectional view.

15. The structure of claim 14 further comprising a barrier layer interposed between the conductive feature and the metal layer.

16. The structure of claim 15, wherein the barrier layer is interposed between the conductive feature and the nitride layer.

17. The structure of claim 15, wherein the nitride layer extends along a sidewall of the silicide region.

18. The structure of claim 14, wherein a ratio of a thickness of the metal layer to a thickness of the silicide region is in a range from about 1:2 to about 1:6.

19. The structure of claim 14, wherein sidewalls of the metal layer are free of the nitride layer.

20. The structure of claim 14, wherein a bottom surface of the metal layer is free of the nitride layer.

* * * * *